United States Patent
Kalokitis et al.

(10) Patent No.: US 7,253,642 B2
(45) Date of Patent: Aug. 7, 2007

(54) METHOD FOR SENSING AN ELECTRIC FIELD

(75) Inventors: David Kalokitis, Robbinsville, NJ (US); Peter Zalud, New Hope, PA (US); David Christopher Berends, Pennington, NJ (US); Christos Alkiviadis Polyzois, Lawrenceville, NJ (US)

(73) Assignee: Power Survey Company, Kearney, NJ (US)

( * ) Notice: Subject to any disclaimer, the term of this patent is extended or adjusted under 35 U.S.C. 154(b) by 0 days.

(21) Appl. No.: 11/224,910

(22) Filed: Sep. 13, 2005

(65) Prior Publication Data

US 2006/0139032 A1    Jun. 29, 2006

Related U.S. Application Data

(60) Provisional application No. 60/641,470, filed on Jan. 5, 2005, provisional application No. 60/639,054, filed on Dec. 23, 2004.

(51) Int. Cl.
*G01R 27/26* (2006.01)
*G01R 29/12* (2006.01)
*G01R 23/16* (2006.01)

(52) U.S. Cl. .................. 324/686; 324/457; 702/77
(58) Field of Classification Search ............ 324/686, 324/457
See application file for complete search history.

(56) References Cited

U.S. PATENT DOCUMENTS

| | | | |
|---|---|---|---|
| 3,309,690 A | 3/1967 | Moffitt | |
| 3,546,587 A | 12/1970 | Turecek | |
| 3,662,260 A | 5/1972 | Thomas et al. | |
| 3,761,803 A | 9/1973 | Slough | |
| 3,774,108 A | 11/1973 | Ogilvie | |
| 3,774,110 A | 11/1973 | Roveti | |
| 3,786,468 A | 1/1974 | Moffitt | |
| 3,878,459 A | 4/1975 | Hanna | |
| 4,007,418 A | 2/1977 | Hanna | |
| 4,277,745 A | 7/1981 | Deno | |
| 4,349,783 A | 9/1982 | Robson et al. | |
| 4,359,926 A | 11/1982 | Sano et al. | |
| 4,714,915 A | 12/1987 | Hascal et al. | |
| 4,716,371 A | 12/1987 | Blitshteyn et al. | |
| 4,724,393 A | 2/1988 | Kumada et al. | |

(Continued)

OTHER PUBLICATIONS

Sarnoff Corporation, "Advanced Stray Voltage Anomaly Detection System," Proposal No. 2003121, Dated Jul. 24, 2002, 10 Pages.

(Continued)

*Primary Examiner*—Andrew H. Hirshfeld
*Assistant Examiner*—Timothy J Dole
(74) *Attorney, Agent, or Firm*—Synnestvedt Lechner & Woodbridge LLP

(57) ABSTRACT

A method for sensing an electric field includes processing digitized electric field signals, e.g., from an electric field sensing probe. The processing may include performing a Fast Fourier Transform of the digitized electric field signals to provide an indication of the magnitude of the electric field, and may include processing the digitized electric field signals at a rate that is related to the speed at which a movable sensing probe is moving. The method may include performing unweighted and/or weighted averaging in relation to processing electric field data, setting a comparison threshold, providing a human perceivable indication, or a combination of the foregoing.

18 Claims, 10 Drawing Sheets

U.S. PATENT DOCUMENTS

| | | | |
|---|---|---|---|
| 4,758,792 A | 7/1988 | Polonis et al. | |
| 4,983,954 A | 1/1991 | Huston | |
| 5,164,673 A | 11/1992 | Rosener | |
| 5,315,232 A | 5/1994 | Stewart | |
| 5,350,999 A | 9/1994 | Brunda | |
| 5,952,820 A | 9/1999 | Thrasher et al. | |
| 6,008,660 A | 12/1999 | Mahlbacher | |
| 6,087,826 A | 7/2000 | Donath | |
| 6,100,806 A | 8/2000 | Gaukel | |
| 6,242,911 B1 * | 6/2001 | Maschek | 324/658 |
| 6,263,190 B1 * | 7/2001 | Mamori et al. | 455/423 |
| 6,329,924 B1 | 12/2001 | McNulty | |
| 6,411,103 B1 | 6/2002 | Tobias et al. | |
| 6,788,215 B1 | 9/2004 | White | |
| 6,859,141 B1 | 2/2005 | Van Schyndel et al. | |
| 2002/0049063 A1 * | 4/2002 | Nohara et al. | 455/456 |
| 2003/0071628 A1 | 4/2003 | Zank et al. | |
| 2003/0117943 A1 * | 6/2003 | Sakata et al. | 370/210 |

OTHER PUBLICATIONS

Sarnoff Corporation, "A Sensor System for Detecting Stray Voltages on Covers, Grates, Light Poles and Other Structures," Report, Dated: ca. 2002, 23 Pages.

* cited by examiner

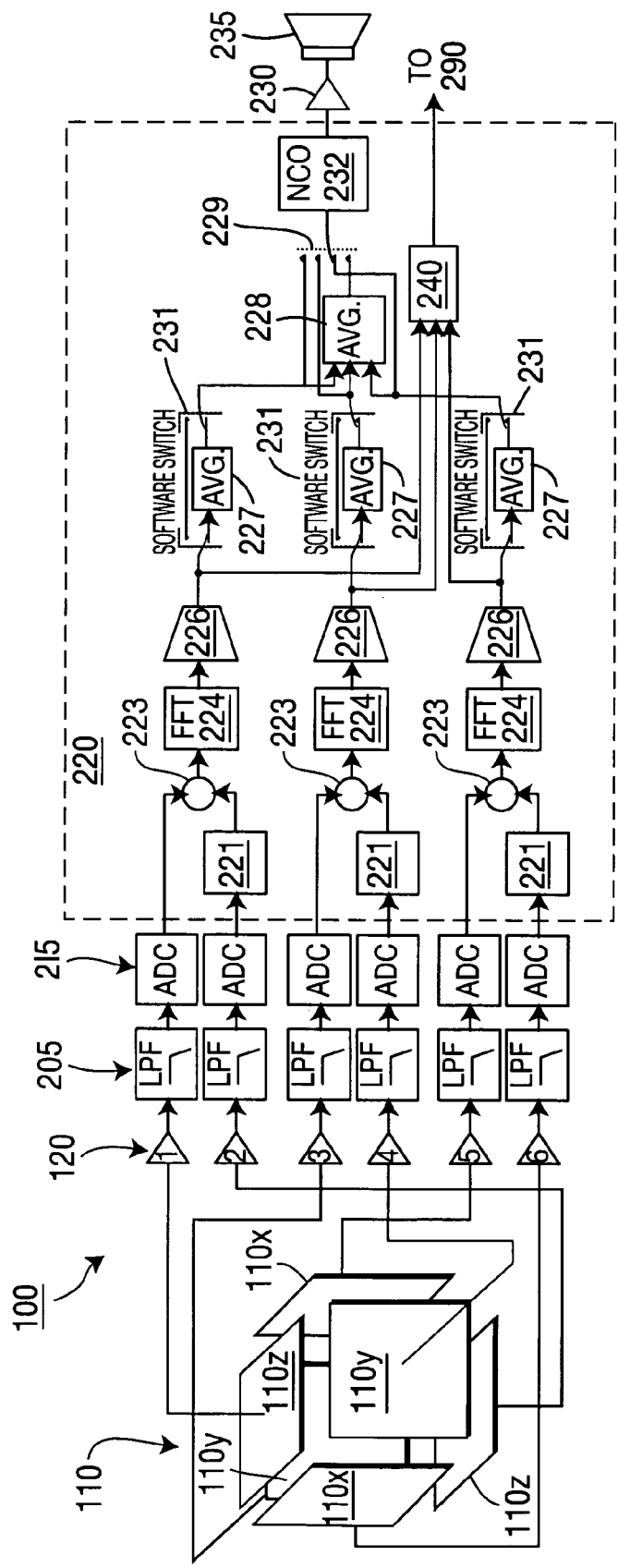
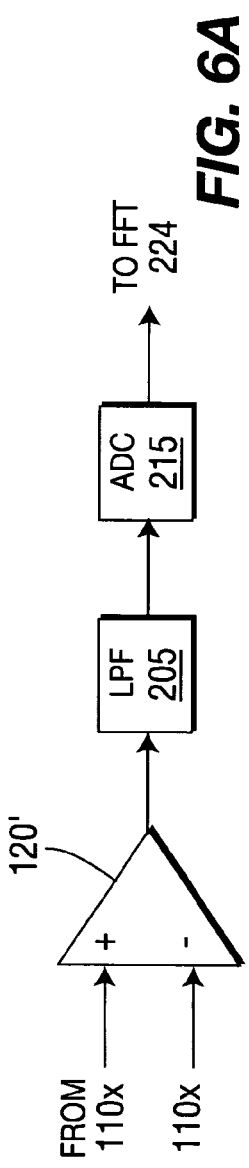
FIG. 6
FIG. 6A

METHOD FOR SENSING AN ELECTRIC FIELD

This Application claims the benefit of: U.S. Provisional Patent Application No. 60/639,054 filed Dec. 23, 2004, and of U.S. Provisional Patent Application No. 60/641,470 filed Jan. 5, 2005.

The present invention relates to a method for sensing an electric field.

Large power distribution systems, especially those in large metropolitan areas, are subject to many stresses, which may occasionally result in undesirable or dangerous anomalies. An infrequent, but recurrent problem in power distribution infrastructure is the presence of "stray voltages" in the system. These stray voltages present themselves when objects, such as manhole covers, gratings, street light poles, phone booths, and the like, become electrically energized, e.g., at 120 volts AC. A conductive path may be established between underground secondary network cabling and the object by physical damage to insulation that causes direct contact or by the introduction of water which serves as a conductor. These energized objects present a danger to people and animals that may come in contact with them.

Sensing the stray voltage by detecting electromagnetic radiation is impractical because the wavelength of a 60 Hz electromagnetic wave is about 5000 Km (about 3107 miles). To effectively radiate electromagnetic waves, the radiating object (manhole cover or light pole) should represent at least ¼ wavelength (about 776.75 miles) and a receiving "antenna" should be 1½ to 2 wavelengths away from the emitting source (about 6214 miles). Two wavelengths is the distance required for the electric and magnetic fields to come into time phase and space quadrature where they behave as a plane wave. A sensing system will typically be perhaps 10 ft. to 30 ft. away from the energized object, so that sensing will take place in the extreme near field where electric and magnetic fields exist in a complex temporal and spatial pattern, not as a unified electromagnetic plane wave. Therefore, the electric and magnetic fields must be considered and measured separately.

Because power distribution networks typically include many miles of buried cable carrying perhaps thousands of amperes of current, the magnetic field in any one location due to such normal load is likely to be very high. Detecting magnetic fields arising from a relatively weak stray voltage anomaly would be very difficult due to the interference from strong ambient magnetic fields arising from normal loads. Therefore, the best way to detect a stray voltage anomaly is to sense the electric field (E-field).

Because electric distribution systems are spread out over vast geographic areas, including urban, suburban and rural areas, a portable non-contacting sensor and method for sensing an electric field while moving would be desirable. For example, a sensor and method that could do so while moving at speeds of 10-25 miles per hour (about 16-40 km/hr) would be desirable.

Accordingly, there is a need for a method for sensing an electric field that is suitable for a movable sensor, e.g., one that could be operated from a moving vehicle, thereby allowing for drive-by inspection, which would greatly speed the locating of these potentially dangerous voltage anomalies and thereby to improve safety.

One aspect of a method for sensing an electric field comprises:
   receiving a digitized representation of an electric field sensed by a movable sensing probe;
   sensing a speed at which the movable sensing probe is moving;
   processing the digitized representation of the electric field at a rate that is related to the speed at which the movable sensing probe is moving for defining a threshold;
   performing a Fast Fourier Transform on the digitized representation of the electric field at a rate that is a multiple of the expected frequency of the electric field; and
   comparing the Fast Fourier Transformed digitized representation of the electric field with the threshold to provide a human perceivable indication of the electric field.

Another aspect of the method for sensing an electric field comprises:
   receiving a digitized representation of an electric field sensed by a movable probe;
   sensing a speed at which the movable probe is moving;
   processing the digitized representation of the electric field at a rate that is related to the speed at which the movable probe is moving; and
   comparing the processed digitized representation of the electric field with a threshold to provide a human perceivable indication of the electric field.

Another aspect of the method for sensing an electric field comprises:
   receiving a digitized representation of an electric field;
   performing a Fast Fourier Transform on the digitized representation of the electric field at a rate that is a multiple of the expected frequency of the electric field; and
   comparing the Fast Fourier Transformed digitized representation of the electric field with a threshold to provide a human perceivable indication of the electric field.

BRIEF DESCRIPTION OF THE DRAWING

The detailed description of the preferred embodiment(s) will be more easily and better understood when read in conjunction with the FIGURES of the Drawing which include:

FIG. 6 is a schematic diagram illustrating the operation of the example sensor system employing digital electronic processing of FIG. 5, and FIG. 6A shows an alternative arrangement for a portion thereof.

Figure 1A:
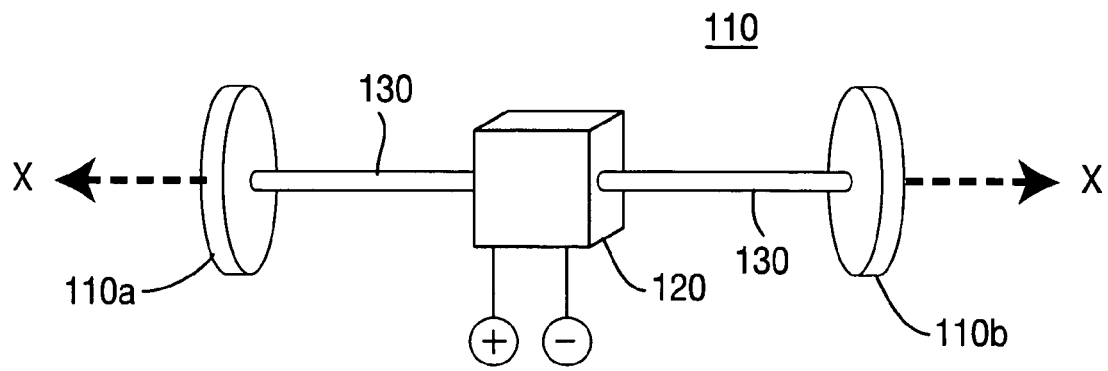
FIG. 1A is a schematic diagram of an example differential probe arrangement.

In the Drawing, where an element or feature is shown in more than one drawing figure, the same alphanumeric designation may be used to designate such element or feature in each figure, and where a closely related or modified element is shown in a figure, the same alphanumerical designation primed or designated "a" or "b" or the like may be used to designate the modified element or feature. Similarly, similar elements or features may be designated by like alphanumeric designations in different figures of the Drawing and with similar nomenclature in the specification. It is noted that, according to common practice, the various features of the drawing are not to scale, and the dimensions of the various features are arbitrarily expanded or reduced for clarity, and any value stated is by way of example only.

DESCRIPTION OF THE PREFERRED EMBODIMENT(S)

Separating the 60 Hz electric field (E-field) of a stray voltage anomaly from other harmless 60 Hz E-fields at a reasonable distance is difficult, and is more difficult when moving, especially at a substantial speed. Consequently, the described sensor/detector system 100 gathers much information about the 60 Hz E-field. This includes detecting the unambiguous direction of the E-field in three dimensions as the sensor/detector 100 moves by the stray voltage anomaly while in the presence of other harmless fields. To this end, three orthogonal sensor probes 110, 110' and a processing system 200 are provided that can sense the amplitude and phase difference between the E-field components detected by each of the three sensor probes 110, 110'.

Given that there is a great deal of 60 Hz energy in the target environment, digital processing is provided to help differentiate between harmful and harmless sources. While amplitude information alone can be processed to provide useful detection capability, further processing is desirable. Where sensor system 100 is located on a movable platform, such as a service vehicle, we have discovered that the velocity of the platform can be employed to aid in filtering the sensor probe 110, 110' output. Typical sources of stray voltage include manhole covers and lamp poles that become coupled to 60-Hz potentials, e.g., anomalously. These stationary objects generate E-fields similarly to a point source.

As the sensor 100 and platform approach and move away from the source, a commensurate rise and decrease in signal level is expected. A normalized space/time window has been developed based on the platform velocity in which the expected signal amplitude from such point source should track as the platform passes the source of a stray voltage. Impulse and constant noise sources will exhibit a largely different signature than does a point source. The platform velocity or speed is converted to frequency with which the 60 Hz energy is evaluated, producing about one evaluation of the 60 Hz field energy for each 0.3-0.6 meter (1-2 feet) of travel. This technique assists to differentiate noise sources from desired measurement data, and does not require a 60 Hz reference signal to provide a phase reference.

An output signal that facilitates additional decision making ability for a user is achieved by providing the system 100 user with near real time information pertaining to the 60 Hz signal level. Generation of an audible tone output signal having a pitch that is proportional to the signal strength of the E-field provides a powerful tool to aid the user in determining the source and potential danger of 60 Hz sources. Visual cue output signals, such as observation of nearby lamp poles, manhole covers, overhead power distribution lines, and the like, combined with the audible tone allows the user to operate sensor system 100 much like a police radar detector or a hand-held metal detector is used. A user rapidly gains experience in differentiating between potentially dangerous conditions and harmless conditions by learning the characteristics of the audible signals produced by sensor system 100 under such conditions.

Sensor Probe Arrangement:

FIG. 1A is a schematic diagram of an example differential probe 110 arrangement. E-field probe 110 uses a differential sensor because in the mobile as well as in other field applications, the sensor 100 will not have access to a ground reference.

Probe 110 comprises two spaced-apart metalized plate electrodes 110a, 110b, separated by an insulating structure 130. The probe structure 130 must be rigid so that vibration or other physical motion of the probe 110 while in the presence of static and low frequency fields does not cause spurious output in the 60 Hz frequency region. The plate electrodes 110a, 110b are connected to a high input impedance differential pre-amplifier 120. Sensitivity of probe 110 is a function of the size and separation of the plate electrodes. A high input impedance amplifier 120 is desirable, e.g., about 60 Tera-ohms.

Not only does a stray voltage anomaly sensor system 100 have to contend with background emissions from electrified devices such as storefront signs, but also with electric field emissions generated by people. As people move about, e.g., as pedestrians, they tend to generate electric charges on their clothing; and these charges can induce a voltage in sensor probe 110. These interfering background E-fields caused by the electric charges associated with people typically occur in the DC to 20 Hz frequency range. This problem may be mitigated in the described arrangement by employing feedback in the differential pre-amplifier 120 that reduces its sensitivity to low frequency fields without reducing the very high input impedance at 60 Hz that helps give sensor system 100 its high sensitivity to 60 Hz fields.

Figure 1B:
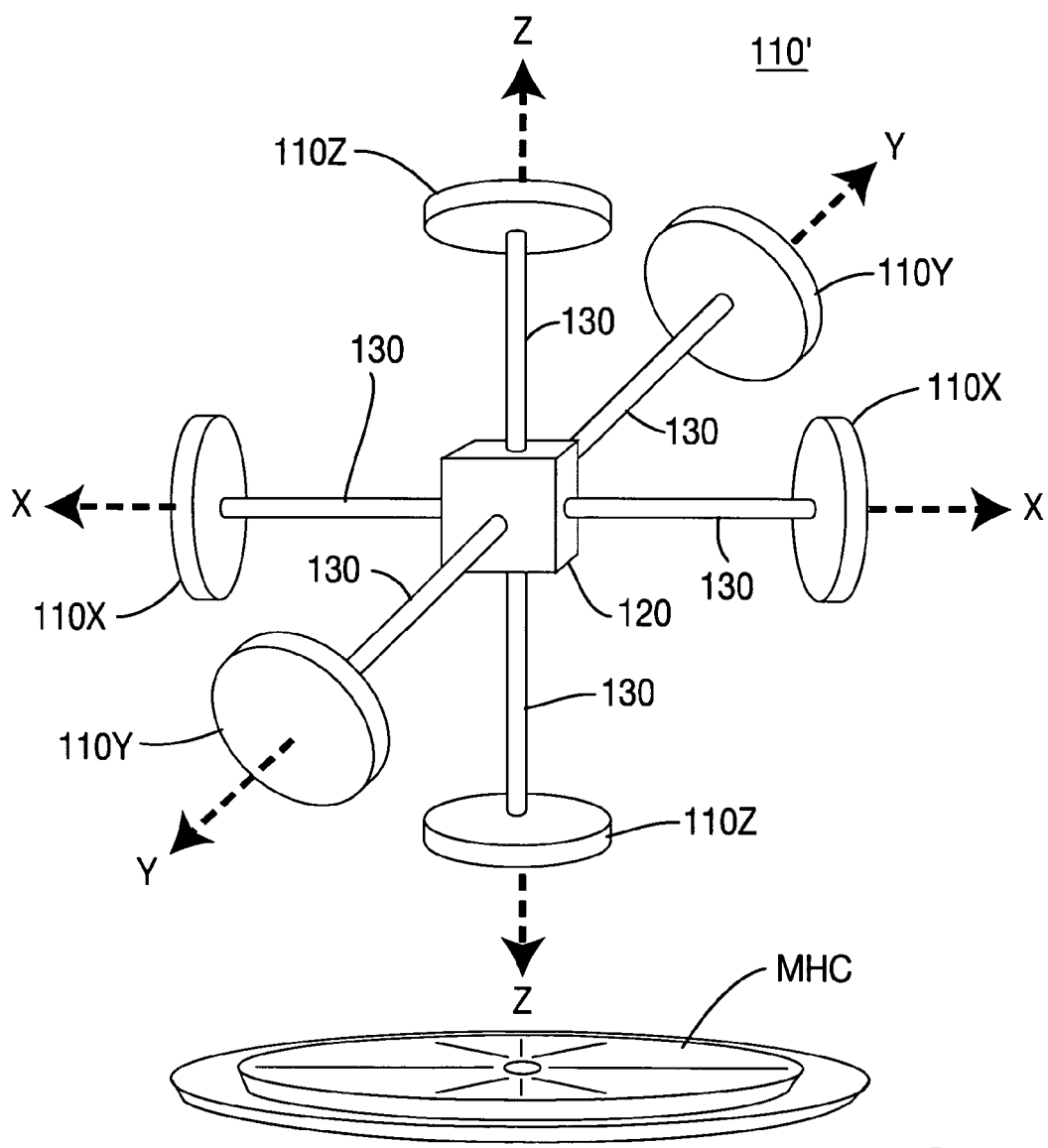
FIG. 1B is a schematic diagram of an example of a three-axis (tri-axial) differential probe arrangement.

FIG. 1B is a schematic diagram of an example of a three-axis (tri-axial) differential probe arrangement 110'. Three axis or tri-axial probe arrangement 110' is employed to make X, Y and Z-axis E-field measurements simultaneously. An example probe 110' arrangement, also referred to as a sensor head 110', which is depicted schematically in relation to a manhole cover MHC, comprises three sets of spaced apart plate electrode pairs 110x-110x, 110y-110y, 110z-110z, of the sort shown in FIG. 1A arranged in three mutually orthogonal directions and supported by a dielectric structure 130. A high input impedance amplifier 120 is associated with each pair of electrodes, and may be embodied in any arrangement of differential circuitry, of single ended circuitry, or a combination thereof, as may be convenient.

Figure 2:
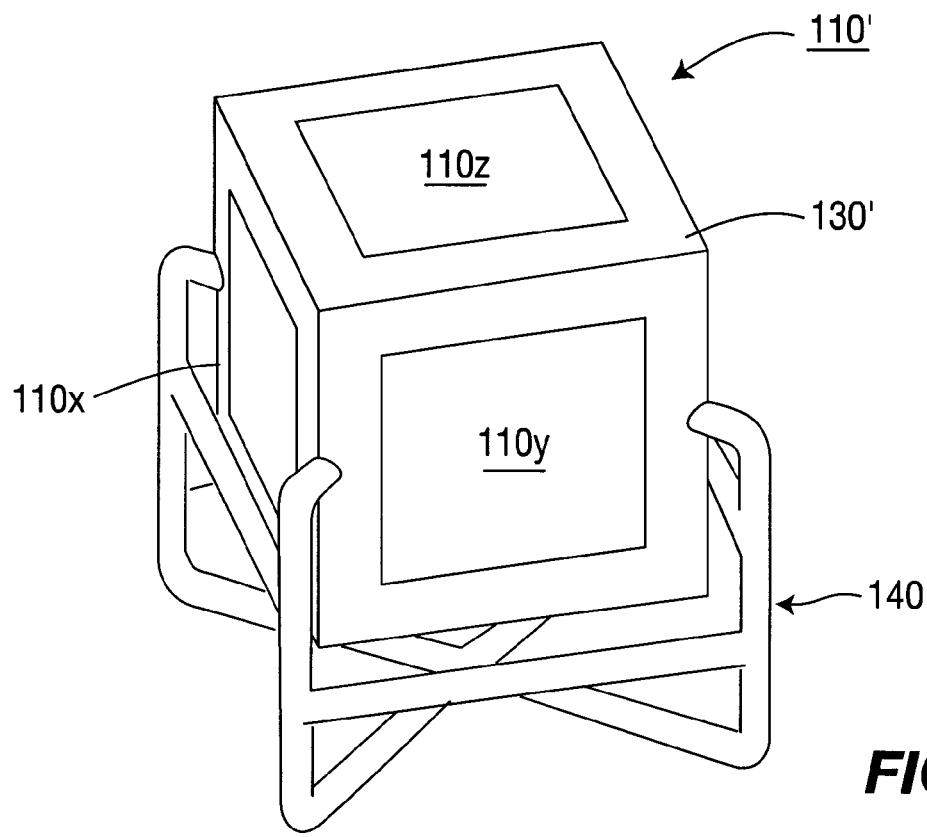
FIG. 2 is an illustration of a tri-axial sensing probe arrangement mounted in a radome arrangement.

FIG. 2 is an illustration of a tri-axial sensing probe arrangement 110' mounted in a radome arrangement 130'. Radome 130' positions the six probe electrodes 110x-110x, 110y-110-y, 110z-110z as if on the six surfaces of a cube, which may be referred to as a radome 130'. The structure may be a cube or may merely position the electrodes in appropriate positions as if they were on the surfaces of a cube. Electrode structure 110x-110x, 110y-110-y, 110z-110z may be supported by a support structure 140 that may be affixed to a vehicle, e.g., a service vehicle or a trailer. A cube structure 130' of suitable dielectric plastic, e.g., Styrofoam or urethane foam, or of wood or plywood, is contemplated. An example support structure 140 of dielectric tubular members, e.g., of PVC pipe, is illustrated.

It is noted that useful arrangements of a probe 110, 110' having one, two or three pairs of electrodes 110x, 110y, and/or 110z, may be employed. For example, in a certain utilization it may be universal or nearly universal that the signals from one pair of electrodes does not ordinarily provide electric field data that is of interest, e.g., as where high-field producing overhead power distribution wires are present, and so the pair of electrodes, e.g., 110z, that sense the vertical field components may be, but need not be, omitted.

Figure 3A:
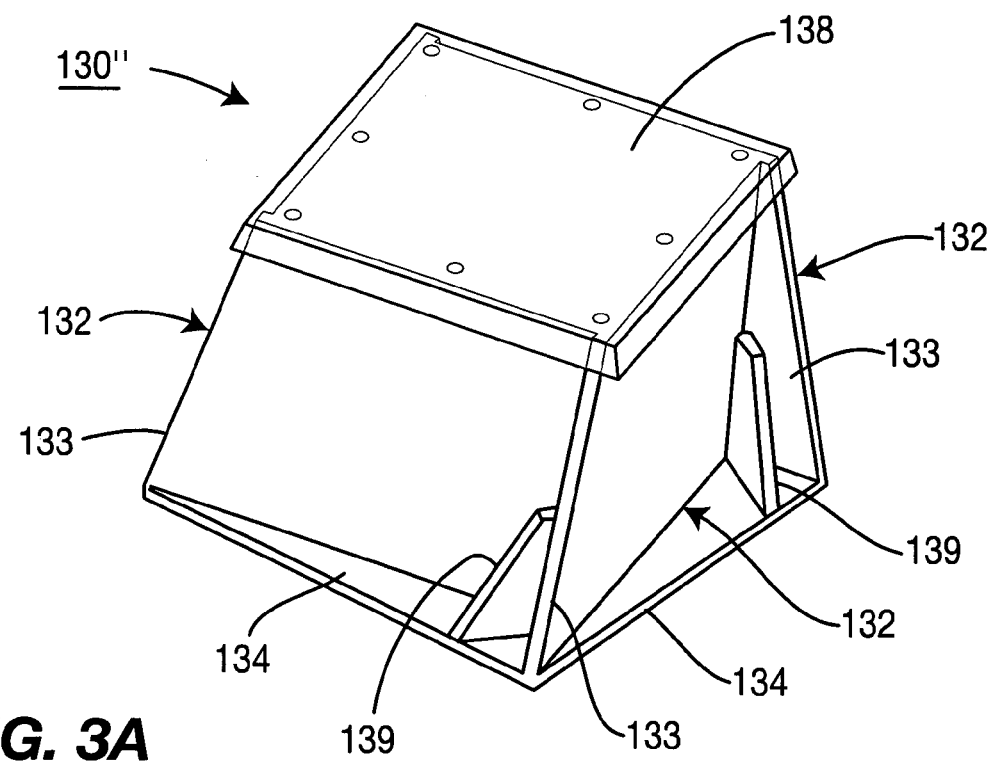
FIGS. 3A-3B are illustrations of an isometric view and a top view of a tri-axial sensing probe arrangement mounted in a radome arrangement.
Figure 3B:
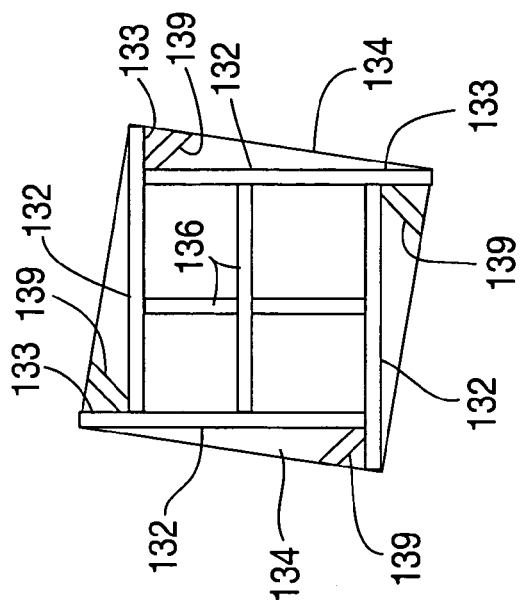
Figure 3C:
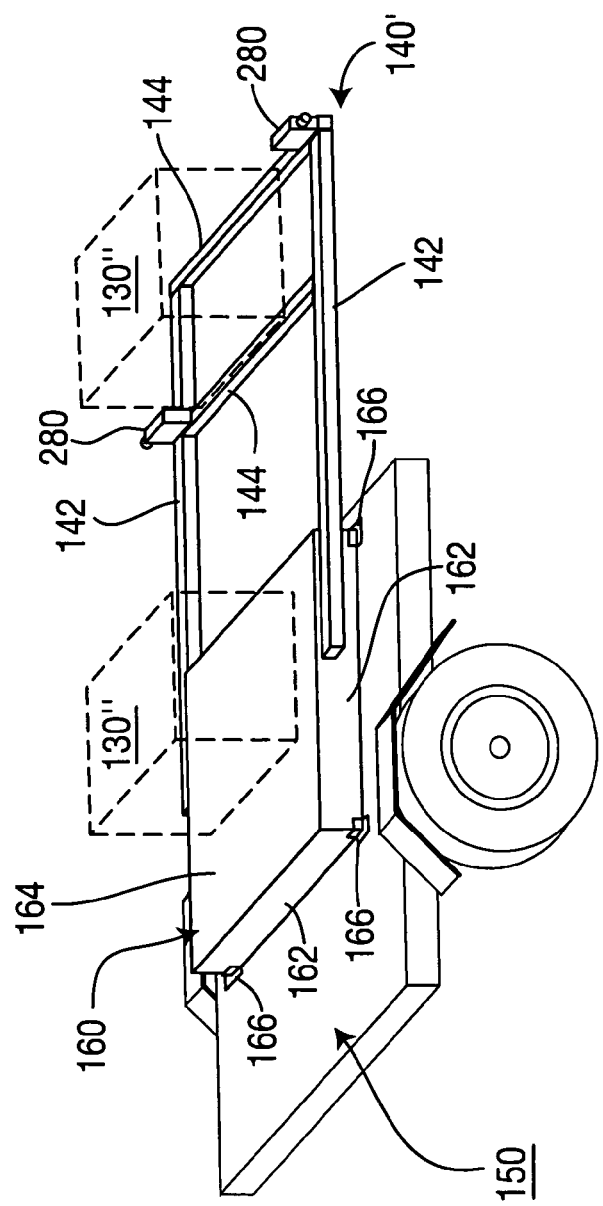
FIG. 3C illustrates the mounting thereof on a vehicle.

FIGS. 3A-3B are illustrations of an isometric view and a top view of a tri-axial sensing probe arrangement 110' mounted in a radome arrangement 130", and FIG. 3C illustrates the mounting thereof on a vehicle 500. Cubical radome 130" comprises four sides 132 joined at corners of a cube. Each of sides 132 is trapezoidal in shape comprising a square portion defining one side of a cube and a contiguous triangular portion 133 that serves as a stiffening member in conjunction with base 134 to which sides 132 are fastened. Base 134 is a square having a side length substantially the tip-to-tip 133-133 dimension of adjacent sides 132, with the tips 133 at the corners of base 134. A square top 138 is fastened to sides 132. Internal to radome 130" are a pair of substantially rectangular stiffeners 136 that intersect substantially perpendicularly and are fastened at the mid-lines of respective sides 132, and to base 134 and top 138. Additional stiffeners 139 maybe provided at the corners of radome 110" at an angle inside the corners defined by stiffeners 133 and their respective adjacent sides 132.

In one example embodiment of a sensor head 110' radome 130', 130", six 12 inch by 12 inch (about 0.3 by 0.3 meter) square copper electrodes 110x-110x, 110y-110-y, 110z-110z are mounted to the six surfaces of a varnished plywood cube of 18 inches (about 0.46 meter) along each edge. A plywood structure 130" of ¾-inch (about 7-8 cm) thick plywood, which is inexpensive, is relatively stiff and rigid, is non-conductive and is easy to machine, coated with a clear urethane varnish, has been found satisfactory. Tongue-and-groove joints joined with glue provide satisfactory stiffness. Copper electrodes 110x-110x, 110y-110-y, 110z-110z are disposed on each face 132, 134, 138 of radome 130", e.g., in machined pockets of suitable size and depth on each face 132, 134, 138 thereof. Crossed plywood interior stiffeners 136, which may be formed of one square plywood stiffener and two rectangular plywood half stiffeners, may be utilized to support electronic circuits including amplifiers 120 and the wiring therefor.

A rigid dielectric support frame 140, e.g., of wood or PVC pipe, may be employed to suspend the cube about 0.9-1.6 meters (about 3-5 feet) from the vehicle and about 0.9-1.6 meters (about 3-5 feet) above the ground (e.g., pavement). A substantial distance, e.g., 0.9-1.6 meters (about 3-5 feet), appears desirable so that the effects of movement of the cube, e.g., due to vehicle movement, surface (pavement) irregularities, vehicle suspension motion, and/or cube support movement, is relatively small relative to the distance from the vehicle and from the ground. The high input impedance amplifiers 120 associated with the three pairs of electrodes 110x-110x, 110y-110-y, 110z-110z are preferably disposed within the cube defined by electrodes 110x-110x, 110y-110-y, 110z-110z.

One example support 140 comprises a support frame base 160 that is mounted to a wheeled trailer 150 that can be towed by a vehicle such as a truck or automobile, as illustrated in FIG. 3C. One example support frame base 160 is constructed of a 2×8 wood compartmented frame 162 having plywood top and bottom faces 164. Compartments of the support frame base 160 were filled with ballast, e.g., sand, to approach the load weight limit for the trailer 150, e.g., about 100 pounds below the weight limit, so as to reduce the natural frequency of the trailer 150 and its suspension. Extending the probe 110, 110' further from the metal structure of the trailer 150 seemed to improve the sensitivity of sensor system 100.

In one example embodiment, support frame base 160 is mounted to the bed of trailer 150 by four optional vibration isolators 166 located respectively at each of the four corners of base 160 so as to reduce the natural frequency well below 60 Hz, e.g., to about 12.5 Hz. In this example, radome 130" is mounted proximate the center of the top 164 of base 160 above a center compartment of the support frame base 160 which is not filled with sand.

In another example embodiment, support frame base 160 is mounted directly to the bed of trailer 150. Radome 130" is cantilevered behind trailer 150 on a support structure 140' comprising two 2×4 wood outriggers 142 that extend rearward so that radome 130" is about 3 feet (about 0.9 meter) from the rear of support frame base 160 and trailer 150. Outriggers 142 are stiffened, e.g., by one or more 2×4 wood transverse members 144. Rearward portions of trailer 150, such as the rear cross member, may be removed to further separate radome 130" from metal that could distort the field being sensed.

Alternatively, either fixed outriggers or telescoping or other form of collapsible outrigger or extension could be employed so that the radome 130, 130', 130" maybe moved closer to the vehicle (i.e. stowed) for transit and farther from the vehicle (i.e. deployed) for operation. Any form of telescoping and/or collapsible supports, of any suitable dielectric material, could be so employed Wood construction has the advantage of being relatively rigid while also providing damping so that resonances near 60 Hz may be avoided, although other insulating materials may be employed consistently with the high-input impedance of differential pre-amplifiers 120 for probe electrodes 110x-110x, 110y-110-y, 110z-110z. Wood members may be finished with clear urethane varnish to reduce absorption of moisture and improve durability. In addition, wood tends not to accumulate a significant static charge that could generate noise fields, as may certain plastics. Pressure treated wood, varnishes, paints and other finishes, and any pigments and/or impregnants therein, which may be electrically conductive should be avoided. Any suitable plastic or other dielectric material may be employed, however, high dielectric plastics that accumulate static charge in low humidity conditions may produce broadband electrostatic discharges that cause interference with system 100.

While a cubical arrangement of electrodes 110x-110x, 110y-110-y, 110z-110z has desirable symmetry, other non-cubical arrangements may be employed, e.g., a rectangular solid or a spherical arrangement. Likewise, while square electrode plates 110x, 110-y, 110z are shown, electrode plates 110x, 110y, 110z may be circular or rectangular or hexagonal or any other suitable shape. Although radome 130', 130" could be cantilevered from a vehicle, e.g., a small truck or SUV, the length of the extension from the metal structure of such vehicle that would be needed to avoid adverse distortions of the field being sensed can make obtaining suitable stiffness in the support difficult.

Figure 4A:
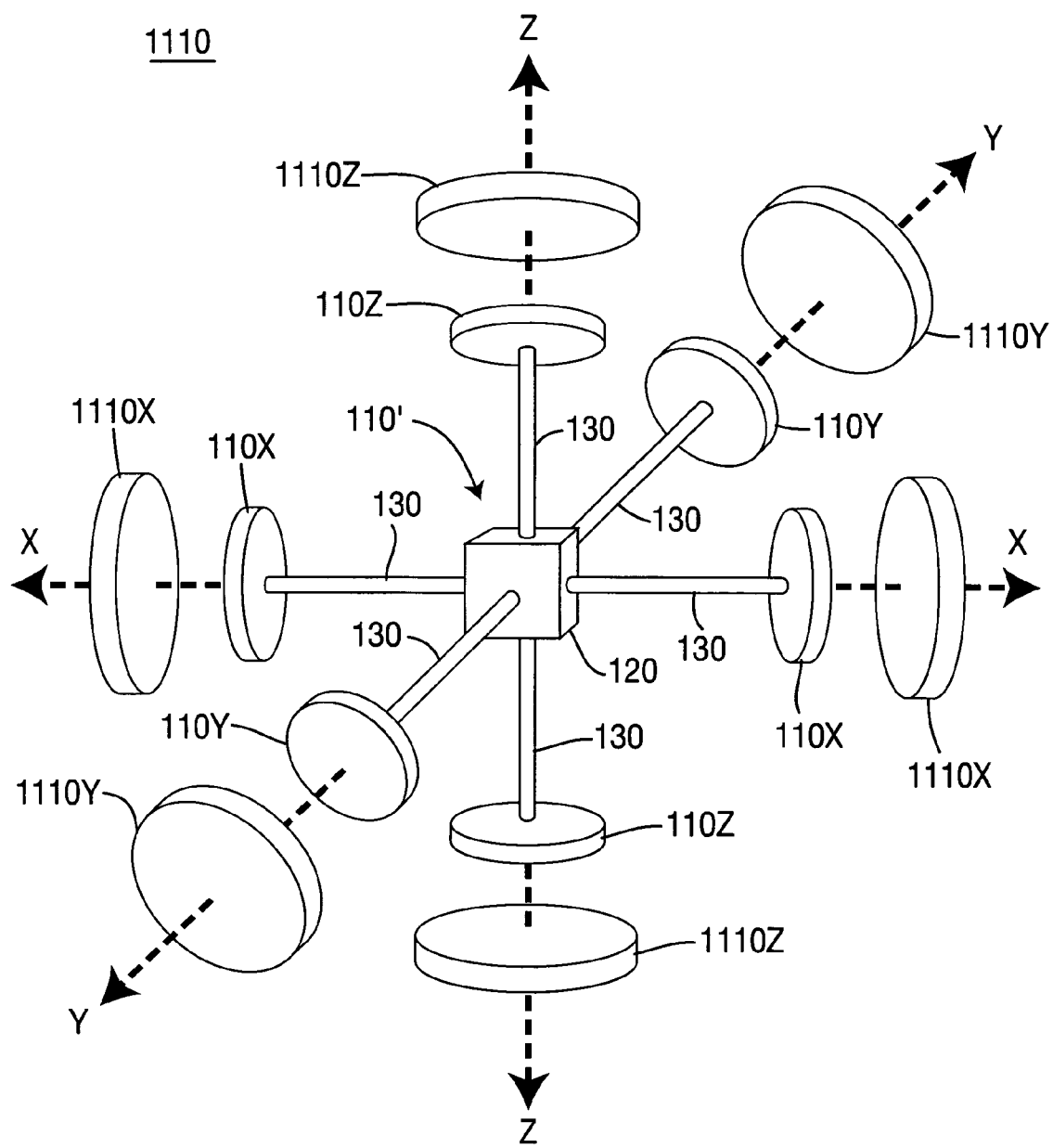
FIGS. 4A and 4B are schematic representations of an example alternative embodiment of the example probe arrangement shown in FIGS. 1B and 2.
Figure 4B:
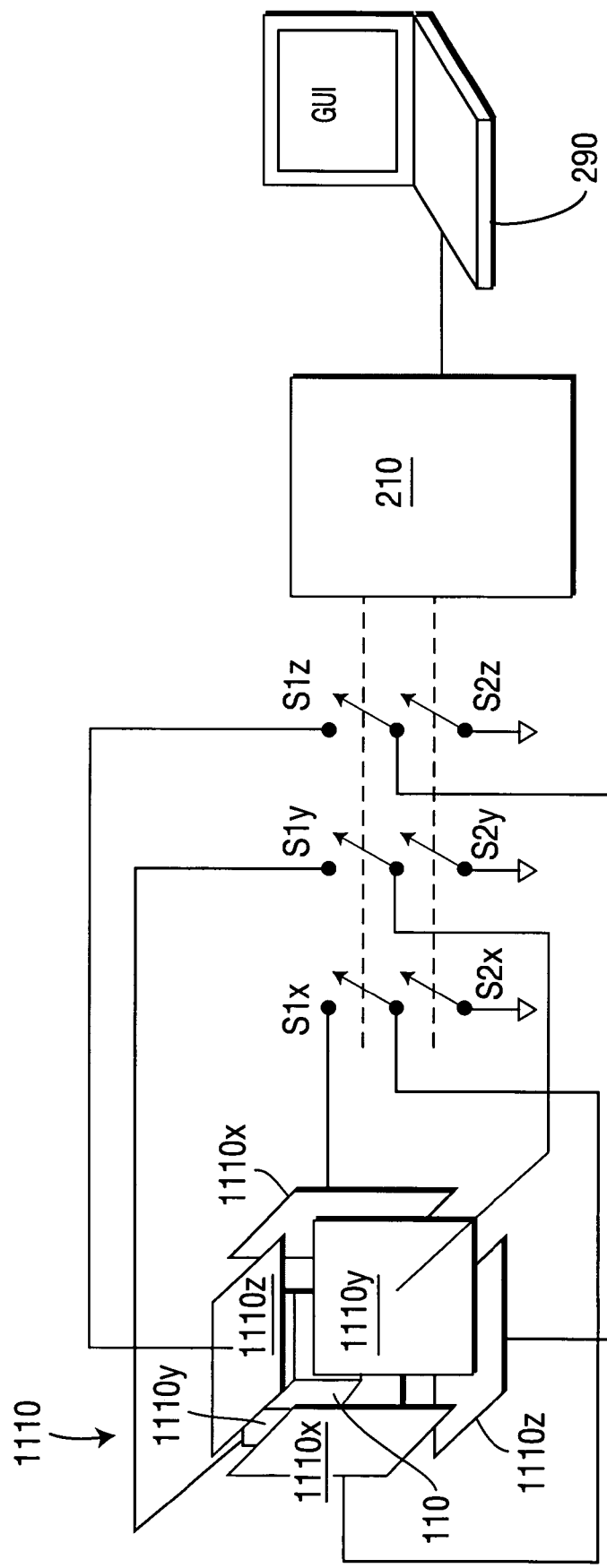

FIGS. 4A and 4B are schematic representations of an example alternative embodiment 1110 of the example probe 110' arrangement shown in FIGS. 1B and 2. Electric field sensing probe 110' comprises three or less pair of electrically conductive electrodes 110x, 110y, 110z, disposed defining a generally cubical space as described above, that are within a space defined by three pairs of electrically conductive auxiliary electrodes 1110x, 1110y, 1110z. Optional auxiliary electrodes 1110x, 1110y, 1110z, may be supported, for example, by a support structure similar to that supporting electrodes 110x, 110y, 110z, of probe 110', or by a different or independent structure, as may be convenient.

Specifically, auxiliary electrodes 1110x are generally planar and are disposed generally parallel to each other and outboard of electrodes 110x (further from the center of structure 120, 130) along the X axis. Similarly, auxiliary electrodes 1110y are generally planar and are disposed generally parallel to each other and outboard of electrodes 110y along the Y axis, and auxiliary electrodes 1110z are generally planar and are disposed generally parallel to each other and outboard of electrodes 110z along the Z axis.

Typically, auxiliary electrodes 1110x, 1110y, 1110z, may be square and may be disposed to define a generally cubical space. Also typically, auxiliary electrodes 1110x, 1110y, 1110z, may be about two times the size of electrodes 110x, 110y, 110z, and may be disposed to define a cube that is about two times as large as that of probe 110', but may be larger or smaller. It is thought preferable that auxiliary electrodes 1110x, 1110y, 1110z be of like shape to and be of larger size than electrodes 110x, 110y, 110z. Also typically, auxiliary electrodes 1110x, 1110y, 1110z, may be generally parallel to electrodes 110x, 110y, 110z, respectively.

When probe 1110' is operating with system 100, each of auxiliary electrode pairs 1110x, 1110y, 1110z, is electrically floating, i.e. is not electrically connected to any of electrodes 110x, 110y, 110z, or to system 100. In this condition, although auxiliary electrode pairs 1110x, 1110y, 1110z, may alter the electric field, they do not unacceptably affect the sensing thereof by electrode pairs 110x, 110y, 110z. When it is desired to confine or to direct the sensitivity of the probe electrodes 110x, 110y, 110z, of probe 1110' in a particular direction, then one or more of auxiliary electrodes 1110x, 1110y, 1110z, are connected one or more other auxiliary electrodes 1110x, 1110y, 1110z. One such connection is to make an electrical connection between the pair of auxiliary electrodes 1110x, 1110y, 1110z that are on the same axis.

By way of example, when a high voltage source is overhead, as where high tension electrical power distribution lines are overhead, the pair of auxiliary electrodes 1110z which are spaced apart along the Z (or vertical) axis may be connected together while making lateral (i.e. fore-aft and left-right) field measurements. As a result of this connection of auxiliary electrodes 1110z, vertically oriented fields, or at least primarily vertically oriented fields, from overhead sources are kept from leaking into or causing signal output on the X and Y axis sensor electrode plates 110x, 110y, or at least the effect of such vertically oriented fields on the X and Y axis sensor electrode plates 110x, 110y is substantially reduced. In addition, and optionally, the pair of auxiliary electrodes 1110z may be connected to a reference point, or to a ground, if available. Alternatively, any pair of auxiliary electrodes 1110x, 1110y, 1110z, may be connected together to similarly increasing directional sensitivity.

Also by way of example, when a high voltage source is alongside, as where high tension electrical power distribution equipment is nearby and close to ground level, the two pair of auxiliary electrodes 1110x and 1110y which are spaced apart along the X and Y (or lateral) axes may be respectively connected together while making vertical (i.e. Z axis) field measurements. As a result of these connections of auxiliary electrode pairs 1110x, 1110y, laterally oriented fields, or at least primarily laterally oriented fields, from ground-level sources are kept from leaking into or causing signal output on the Z axis sensor electrode plates 110z, or at least the effect of such laterally oriented fields on the Z axis sensor electrode plates 110z is substantially reduced. In addition, and optionally, the pairs of auxiliary electrodes 1110x, 1110y may be connected to a reference point, or to a ground, if available. Alternatively, any two pair of auxiliary electrodes 1110x, 1110y, 1110z, may be connected together to similarly increasing directional sensitivity.

As illustrated in FIG. 4B, auxiliary electrodes 1110x are selectively connectable to each other by switch S1x, auxiliary electrodes 1110y are selectively connectable to each other by switch S1y, and auxiliary electrodes 1110z are selectively connectable to each other by switch S1z. Switches S1x, S1y and S1z are sufficient to provide the desired respective selectable switching function for auxiliary electrode pairs 1110x, 1110y, 1110z so as to enable the selective directing of the sensitivity of field sensing electrode pairs 110x, 110y, 110z, respectively. Control of switches S1x, S1y, S1z may be effected using computer 290 via processor 210, typically by activating respective toggle-type commands using GUI 295 of computer 290, although other control arrangements may be employed.

In addition and optionally, it may be desirable to be able to connect electrode pairs 1110x, 1110y, 1110z to a common reference point, which could be ground, if a ground is available, or could be a power supply line or a power supply common line or could be a vehicle structure. In other words, common reference may be any reference point that is likely to be relatively fixed in potential relative to the potentials utilized by system 100. Auxiliary electrodes 1110x are selectively connectable to common by switch S2x, auxiliary electrodes 1110y are selectively connectable to common by switch S2y, and auxiliary electrodes 1110z are selectively connectable to common by switch S1z. Control of switches S2x, S2y, S2z may be effected using computer 290 via processor 210, typically by activating respective toggle-type commands using GUI 295 of computer 290, although other control arrangements may be employed.

While the foregoing describes an example alternative probe embodiment 1110 as having six (three pair of) sensing electrodes 110x, 110y, 110z, and six (three pair of) auxiliary electrodes 1110x, 1110y, 1110z, such is not necessary. Typically any number of pairs of auxiliary electrodes 1110x, 1110y, 1110z, that is less than or equal to the number of pairs of sensing electrodes 110x, 110y, 110z, may provide a useful probe 1110 arrangement, and a greater number of auxiliary electrodes could be provided. For example, in a circumstance where the vertical field sensing electrodes 110z are omitted, it may be desirable to retain auxiliary electrodes 1110z for directing the sensitivity of probe 1110' for sensing non-vertical fields.

Electronic Signal Processing

Figure 5:
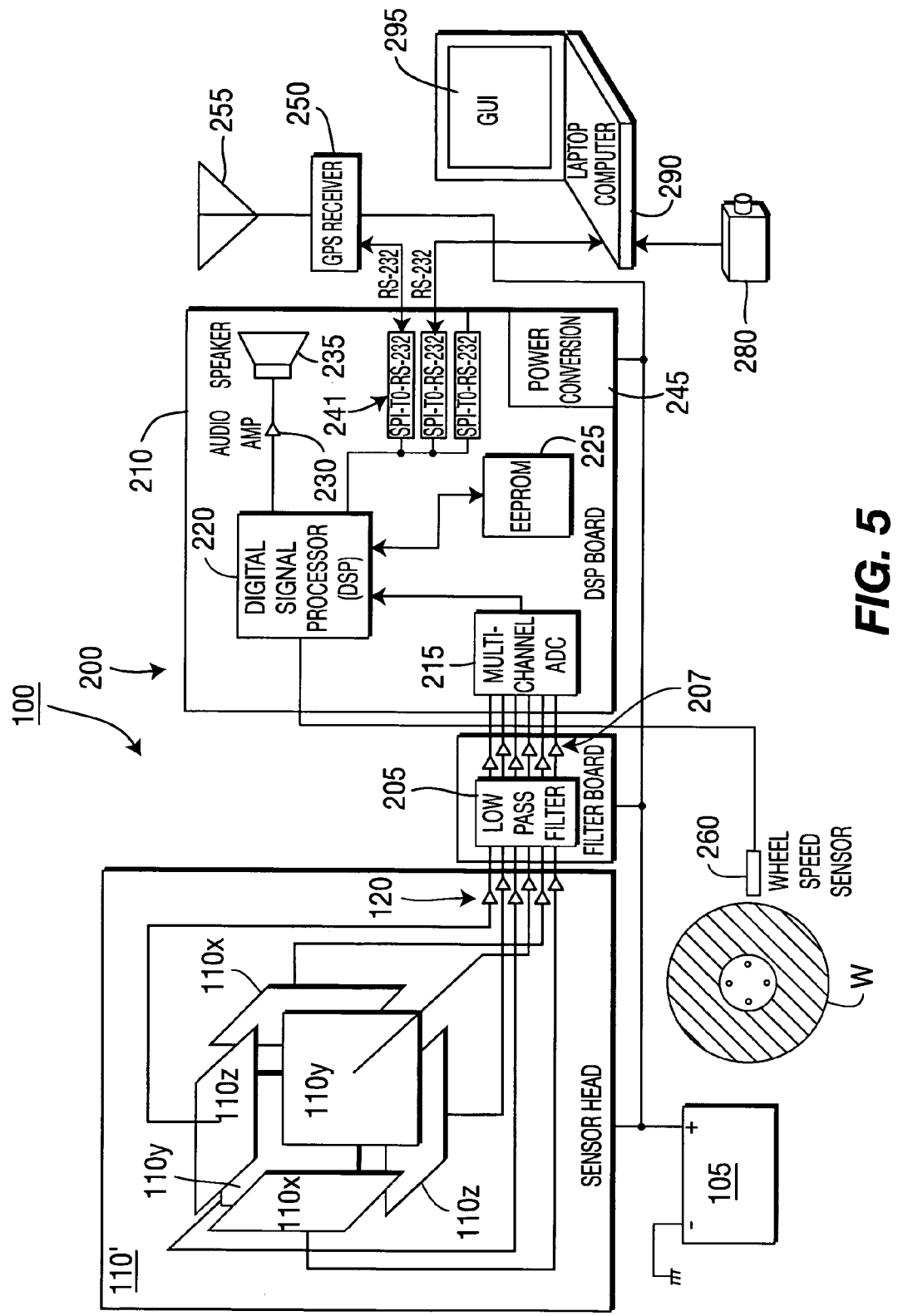
FIG. 5 is a schematic block diagram of an example sensor system employing digital electronic processing.

FIG. 5 is a schematic block diagram of an example sensor system 100 employing digital electronic processing, FIG. 6 is a schematic diagram illustrating the operation of the example sensor system 100 employing digital electronic processing of FIG. 5, and FIG. 6A shows an alternative arrangement 120 for a portion of FIGS. 5 and 6.

The processor 200 arrangement shown in FIGS. 5 and 6 employs a digital processing section 210 capable of processing the probe 110' electrode data in near real time (e.g., with less than one second latency). It is arranged to interface directly to a three-axis stray voltage sensing probe arrangement 110', as described herein. Signal processor 200 is preceded by an analog section 120, 205, including amplifiers 120 and low pass filters 205 coupled to sensor head 110' comprising, e.g., three sets of spaced apart electrode plates 110x-110x, 110y-110y, 110z-110z. Digital processing section 210 comprises a multichannel analog-to-digital converter (ADC) 215, a digital signal processor (DSP) 210, a memory 225 (e.g., an EEPROM 225), an audio amplifier 230, audible transducing device 235 (e.g., a loudspeaker 235), one or more data converters 241 (e.g., uni-directional or bidirectional SPI to RS-232 converters 241), and a source of electrical power (e.g., a power converter 245 operating from a vehicle power system 105).

An advantage of this arrangement is that there is no need for a transmitted or other 60 Hz timing reference and that it may be disposed on and operated from a vehicle moving at a substantial speed, e.g., up to 15-25 miles per hour (about 24-40 km/hr), or faster. In addition, this arrangement processes the sensed stray voltage data in essentially "real time" so as to facilitate an operator understanding and responding to the sensed data. Further, a distance measuring wheel W and/or a wheel speed sensor 260 is employed in the processing of the sensed data to facilitate signal processing while the system 100 is in motion as described herein.

One embodiment of a sensor system 100 according to the described arrangement consistently detected an energized manhole cover at a distance of about 15 feet (about 4.5 meters) when moving at speeds of up to about 10 mph (about 16 km/hr) or less, and consistently detected an energized light pole at a distance of about 25 feet (about 7.5 meters) when moving at speeds of up to about 20 mph (about 32 km/hr) or less.

The analog or input section 205 of processor 200 comprises, for example, six low pass filters 205, one for each probe electrode 110x, 110y, 110z, each preceded by an amplifier 120 preferably having a high input impedance and exhibiting some gain, and followed by a buffer amplifier 207. The low pass filter 205 cutoff frequency is selected to minimize the effects of aliasing. For example, where the example ADC 215 samples the sensor probe 110' data at a rate of 960 samples per second, a suitable low pass filter 205 may have a cutoff frequency (at −3 dB) of about 240 Hz and a −24 dB per octave slope. Thus, at 900 Hz, the first frequency that directly aliases the 60 Hz frequency of interest, the example low pass filter 205 supplies a rejection or attenuation of about 46 dB.

One example of a suitable ADC 215 operates at a conversion burst rate of 842 KSPS (kilo-samples per second). Every $\frac{1}{960}^{th}$ of a second the ADC 215 is commanded to perform 96 conversions, specifically 16 readings of each of the six sensor plate electrodes 110x, 110y, 110z. The readings converted by ADC 215 may be alternated such that temporal distortion effects are minimized: ADC 215 converts plate electrode 1 (+110z) data, then plate electrode 2 (−110z) data, and so on through plate electrode 6 (−110x). It then repeats this six-conversion sequence 16 times for a total of 96 conversions. This burst of conversions takes approximately 114 microseconds ($\frac{96}{842}$ KHz), which is approximately 11% of the $\frac{1}{960}^{th}$ of second allotted for conversion, while reducing quantization errors by a factor of four. Other ADC arrangements and/or other ADC control arrangements may be employed.

The data is transferred into DSP memory 225 from the ADC 215 via a serial link driven by a Direct Memory Access (DMA) function within the DSP 220. Differential data is obtained from single ended data by DSP 220 by the negation 221 of one of the pair of single ended data values and the summing 223 of one single ended data value with the negated 221 data value.

In the alternative arrangement of FIG. 6A, the single-ended signals from opposing electrodes 110x-110x, 110y-110y, 110z-110z are coupled to the differential-to-single-end amplifiers 120' that provide balanced inputs with gain and convert the signal to single ended analog format to simplify subsequent processing, e.g., by lowpass filters 205. A multistage active lowpass filter 205 then processes the signal to reduce signals other than the desired 60 Hz signal, i.e. to help separate the desired signal from near frequency interfering E-field signals. The signal is then further amplified and buffered 207 and routed by a driver amplifier 207 to ADC 215. Negation 221 and summing 223 are not necessary in this alternative.

Upon completion of each 96 event burst conversion, DSP 220 averages the probe electrode 110x-110x, 110y-110y, 110z-110z data to obtain six values (one for each of the six plates 110x-110x, 110y-110y, 110z-110z), and stores the six values, e.g., in a single row of a 6×256 point matrix of a memory internal to DSP 220. This action is repeated 256 times until the entire matrix of the internal memory of DSP 220 is filled, at which point DSP 220 performs six Fast Fourier Transforms (FFTs) 224 on the six column vectors. Each FFT 224 yields a frequency domain representation of the prior 256 samples (for each sensor plate 110x-110x, 110y-110y, 110z-110z) in the form of 128 complex values. Each of these complex values represents the phase and amplitude of the plate electrode 110x-110x, 110y-110y, 110z-110z signal within a bin of 960 Hz/256=3.75 Hz. The $16^{th}$ FFT bin 226 contains the 60 Hz information, which is the only information that is of interest with respect to sensing stray 60 Hz voltages. Processor DSP 220 calculates the magnitude squared of this bin 226 data (its real part squared summed with its complex part squared), and assigns this value as the field strength for the plate electrode 110x-110x, 110y-110y, 110z-110z that produced it. This process yields six field strength values at a rate of 960 Hz/256=3.75 Hz.

An alternative-processing mode has also been provided to allow the processing of differential data, which may be selectable or may be built in as with the circuits 205 of FIG. 6A. In this mode, differences between time domain values for the parallel plate electrode pairs 110x-110x, 110y-110y, 110z-110z are calculated, resulting in a 3×256 point matrix, which is then processed using the FFT 224 as described in the previous paragraph.

Once the six field strength values (or three differential field strength values) are determined, higher-level procedures employ these six values (or three values) to produce data in a form that is meaningful to the user. For example, a simplistic detection alarm is available to the user that compares the six field strength values (or three differential field strength values) to a user-defined threshold, and activates a simple audible alarm 230, 235, e.g., a pulsing audio alarm, if any of these six values exceeds the threshold. Early testing of stray voltage detection system 100 found this audible alarm 230, 235 methodology to be useful, but limited.

Data may be provided to laptop computer 290 or to any other device for storage and/or further analysis at the user's desire. To this end, DSP 220 includes data streamer 240 which provides the unaveraged data independent of the settings of software switches 229, 231. Data provided by data streamer 240, e.g., in a SPI format, may be converted into another standard digital data format, e.g, into RS-232 format, by data converters 241 of digital processing section 210. Data converters 241 may also convert data received in a given format, e.g., RS-232 format, into a format compatible with DSP 220, e.g., SPI format, as is the case for data provided by global positioning system (GPS) receiver 250. GPS receiver 250 is a standard locating device that receives via antenna 255 signals broadcast by plural GPS satellites orbiting the Earth to determine therefrom its location on the Earth.

The desire to present more information to the user than could a simple alarm led to the development of a more sophisticated audible output 230, 235, i.e. one that produces a continuous output whose pitch is proportional to the field strength. To accomplish the continuous aspect of this audible output, the field strength values need to be calculated at a rate far greater than the basic 3.75 Hz of the FFT data. To this end, the processing algorithm performs the 256-point FFT 224 on the most recent 256 samples collected (for each of the six plate electrodes 110x-110x, 110y-110y, 110z-110z) as before, but to perform this operation at a 60 Hz rate. Thus after every 16 additional averaged sample set values are collected, the FFT 224 is re-performed, producing the six field strength values (one for each plate electrode 110x-110x, 110y-110y, 110z-110z) at a rate of 960 Hz/16=60 Hz. The large degree of time domain overlap from each FFT 224 to the next FFT 224 while using this process produces a far smoother output stream than is produced at the basic 3.75 Hz rate.

Because differential probe electrode 110x-110x, 110y-110y, 110z-110z data has been found to produce superior signal-to-noise ratios compared to that of any single plate electrode 110x, 110y, 110z, the software of DSP 210 is preferably structured to support differential data when using the 60 Hz output data rate mode. The user is given the capability to select, e.g., setting software switches 229, 231, via the graphical user interface (GUI) of laptop computer 290, which of three plate electrode pairs 110x-110x, 110y-110y, 110z-110z to use to drive the system audio output 230, 235 plus a fourth option, the average 228 of all three pairs. The 60 Hz output data then controls a numerically controlled oscillator (NCO) 232 within DSP 220 for producing an audio pitch (tone) that is proportional to field strength. Because the perception of pitch in humans is logarithmic, the raw field strength data is converted to a logarithmic scale by DSP 220, which may be accomplished in any convenient manner, e.g., by means of a look-up table.

For certain DSP devices, e.g., a type TMS320VC5509 digital signal processor available from Texas Instruments located in Dallas, Tex., the NCO 232 producing the audio output (nominally a square wave) is the output of a timer-counter 232 integral to the DSP integrated circuit (IC) 220. DSP 220 sets the frequency of this timer-counter by writing to it a period value. The nominal DSP clock (144 MHz, in one example) causes the timer-counter to count down from this period value to zero, at which point an output signal toggles state from high to low (or from low to high).

The process of this conversion from field strength to audio output 235 is now described. The field strength values produced by the FFT 224 process range from zero to approximately two million. Reasonable example frequencies audible to humans for this type of detection system would fall into a range between approximately 70 Hz and approximately 3 KHz. The 16-bit timer-counter in the DSP 220 features a 4-bit prescaler that allows its incident clock to be pre-divided (prescaled) by a programmable value between 1 and 16. With a prescale factor of 16, an additional divide-by-two frequency reduction occurs due to the toggling nature of the counter-timer output as described above, and at a maximum period value of $2^{16}=65536$, an audio tone of 144 MHz/(16*2*65536)=68.66 Hz results. Because little useful data is contained in field strength values less than about 10, these field strength values are programmed to produce no audible output 235. For a field strength of 10, a 69.3 Hz tone results, brought about by 64939 being written into the timer-counter period register.

Given that typical human hearing can barely discern pitch differences of an eighth of a step (a half-step is defined as a $2^{(1/12)}$ change in pitch, equivalent the difference between adjacent notes in the equal tempered chromatic scale commonly used in western music), the pitch table used is based upon this amount of pitch change, so that discrete pitch changes would be perceived as a continuum by a human listener. Thus, an incremental pitch change in the audio output 235 of the sensor system 100 results in a frequency change of $+/-(1-2^{(1/96)})$, or +−0.7246%. The effect of an apparently continuous pitch output is thus achieved from a discrete pitch system. The 512-step pitch table employed covers a pitch range from 69.3 Hz to $2^{(512/96)}*69.3=2.794$ KHz.

The field strength data from the DSP processing system 210 covers a range from about 10 to 2,100,000, or approximately 5.3 decades. This data is likewise parsed logarithmically to fit the 512 element pitch table, such that any increase of $10^{(1/96)}$ would produce an increase of one increment in pitch. So for every 10 dB that the field strength increases, the pitch of the audio output 275 increases by about one octave. The period value written into the timer counter 232 is thus $144 \times 10^{16}$ divided by 32 (or 4.5 million) divided by the desired output frequency. The 512-element pitch table is thus made up of two columns, one representing field strength, and one representing timer-counter 232 period. The process to determine the output audio pitch finds the field strength table value nearest to, but not greater than, the current actual field strength value, and applies the accompanying period value to timer-counter/NCO 232.

It is noted that the example timer-counter/NCO 232 of DSP 220 that produces the audio output 235 in the described example embodiment actually includes both a period register and a timer register. When the timer register counts down to zero, it reloads from the period register and then counts down from the period value. The process described above only updates the period register, thus avoiding the generation of transient pitch discontinuities that would sound to the ear as a "pop" or "crack." The count register is only updated during high-to-low or low-to-high transitions of the audio output 235, thereby producing a continuous quasi-portamento output tone.

Empirical testing of the entire stray voltage detection system 100 using the audio tone as the principal output to the user indicated that further smoothing of the data would provide what could be considered a more pleasing audible output. Pitch discontinuities caused by vibration of the probe electrodes 110x-110x, 110y-110y, 110z-110z and other transient effects tended to make the audio output 235 significantly less meaningful to the user. A simple unweighted 32-point averager 227 directly preceding the NCO 232 in the audio processing chain, although it introduced an additional latency of $32/60 Hz=0.533$ seconds to the system 100, significantly mitigated these transient effects, increasing user effectiveness at interpreting the audio data 235. The total system latency, with this additional averaging filter 227 enabled (it can be enabled or disabled by the user via software switch 231), is thus 32/60 Hz+256/960 Hz=0.8 seconds. This is specifically the latency between the detection of a field by the sensor plate electrode 110x, 110y, 110z and its resultant tone production by the audio system (e.g., audio amplifier 230 and speaker 235).

An optional Global Positioning System (GPS) receiver 230 provides a location reference including latitude, longitude, elevation, time and date about once per second so that the location of the voltage sensing probe 110 and system 100 is known to a reasonably high precision. GPS position data may be exported to a conventional GPS mapping software for utilization. The GPS location information is stored, e.g., in the memory of DSP 210 or of laptop computer 290, so that there is a stored precision location and time reference associated with the stored measurements of 60 Hz field data from the six probe electrodes 110x-110x, 110y-110y, 110z-110z of the voltage sensing system 100.

Thus, the GPS location data provides a record of the location at which each detected stray voltage field was detected and the time thereof, as may be desired for subsequent analysis, e.g., for reviewing the location of a field anomaly and identifying the source thereof. Because the peak of the response to a source of stray voltage can not be ascertained until after the vehicle has passed the source, the exact location of the source may not be observed until after the time at which it is detected, i.e. until after it is passed. While having this stray voltage and location data recorded is desirable and beneficial, in a typical service environment, e.g., on a city street, it is not practical to stop the vehicle carrying system 100 each time a stray voltage is detected, or to back the vehicle up to ascertain the exact location at which the detection took place.

Alternatively, or additionally, and optionally, one or more imagers 280 may be provided for imaging the environs where the voltage detection system 100 is employed. Specifically, where system 100 is deployed on a vehicle or trailer 150, one or more video imagers or cameras 280 may be provided thereon, typically, one video imager 280 is directed to view in a direction about 90° to the left of the direction of travel and another is directed to view about 90° to the right of the direction of travel, so that images of what is present to the left and to the right of the vehicle 150 are obtained. Video images therefrom are recorded, e.g., by computer 290, or by another suitable memory device, as system 100 moves.

Video images may be obtained at a standard video rate, e.g., at 30 or 60 frames per second, but may be at much slower rates, e.g., one or two frames per second, consistent with the speeds at which the vehicle 150 moves. For example, if a vehicle is moving at between 10 and 20 mph (about 14-28 feet per second or about 4.2-8.5 m/sec.), video at a two frames per second video rate would provide a new image for each about 14 feet (about 4.2 m) or less of travel, which should be sufficient to identify the location at which the stray voltage was detected.

The video images may all be recorded (stored) or only selected images may be recorded. In one example embodiment, video images are stored in a video frame data buffer having a capacity to store a substantial number of frames of video data, e.g., frames representing about thirty (30) seconds of video scenes. As each new frame is stored, the oldest previous frame is lost. Thus, the video data buffer contains video frames for the most recent thirty seconds. Video buffers storing frames representing a longer period of time, or even a shorter period of time, may be employed. A "frame grabber" card of computer 290, e.g., in the form of a PCMCIA card or an internal card, may be employed to synchronize the processed electric field data and/or audio tone with the video data from imager 280.

Upon detection of a stray voltage, the operator can cause the last 30 seconds of video to be stored in a more permanent memory, or in another buffer, e.g., by activating a "Capture" function of computer 290, whereby the video of the scenes to the left and to the right of the vehicle over a thirty second period including the time at which the stray voltage was detected are stored and may be reviewed at the operator's convenience, e.g., either at that time or at a later time. Such storing action may be provided by inhibiting the video buffer from accepting additional frames of video data, thereby freezing the data then stored therein, or may be by transferring the data then stored in the video buffer to another memory device, e.g, the hard drive of computer 290 and/or a removable memory, e.g., a floppy disk, a CD ROM disk, a thumb drive, a memory card, a memory stick, or other memory device.

Preferably, not only are the video images stored, but the audio tones produced by system 100 (and/or data representing the tones), the GPS location data, the wheel speed sensor data, or a combination thereof, are stored so that the video images may be reviewed in synchronism with the detection tone (and/or data representing the tone) and the GPS location to allow a user/operator to more accurately locate where the stray voltage was detected. For example, upon play back of the video data, the GPS location information may be displayed and/or the audio tone may be reproduced, so that the operator can accurately locate the source of the stray voltage. Control thereof may by icons and other controls provided by a graphical user interface (GUI) of computer 290. Playback of the synchronized stored data may also be utilized for training personnel in operation of system 100.

Because system 100 may be operated in urban/city environments where buildings and other obstacles distort and/or block signals from a GPS satellite system from reaching a GPS receiver via a direct path, GPS location information may have degraded accuracy, or may not be available. Wheel speed sensor 260 provides a suitable substitute for highly accurate GPS location information, or may be utilized in conjunction therewith. Typically, wheel speed sensor 260 detects revolutions of wheel W and, because the circumference of wheel W is known, distance and speed can be determined from the revolution of wheel W.

One example wheel speed sensor 260 produces four signals, typically pulses, for each revolution of wheel W, wherein each signal represents about 16 inches (about 40-41 cm) of linear travel. Most manhole covers MHC are about 30-40 inches (about 0.75-1.0 m) in diameter, and so wheel speed indications every one to two feet (about 0.3 to 0.6 m) is sufficient to locate a manhole MHC cover having stray voltage thereon. One suitable embodiment of wheel speed sensor 260 utilizes a Hall-effect sensor mounted so that the wheel lugs (studs and nuts) that secure wheel W to an axle pass close enough that the Hall-effect sensor produces a detectable output pulse therefrom.

An optional laptop computer 290 or other suitable apparatus provides a convenient graphical user interface (GUI) for an operator to control the operation of the stray voltage sensor probes 110 and system 100, in particular, the digital signal processor 210, and to monitor field data as measured. For example, an operator may adjust the values of the constants and scaling factors utilized in the detection and averaging processing for producing an audible alarm as described. An example of a command set for computer 290 is set forth in Appendix A below. The commands may be executed by single keystroke entries, as in the example herein, or may be executable by plural keystroke entries. Laptop computer 290 also provides a convenient means for storing a record or log of the measured field and location (GPS) data for subsequent review and/or analysis, as might be desired for determining when and where a stray field existed.

Preferably, measured field data from the six probes is stored as measured, e.g., as six sets of data as produced by the six probe electrodes 110x-110x, 110y-110y, 110z-110z or as three sets of differential data as produced the three pair of probe electrodes 110x-110x, 110y-110y, 110z-110z, or both. Data may be stored in a memory of DSP 210 or in a memory or storage of laptop computer 290. Typically, laptop computer 290 may not be provided where system 100 is portable by a human operator, the operator having freedom to determine from the audio tones alone what is the source of the stray voltage detected by system 100.

Preferably, the measured probe data stored is "raw" data, e.g., as developed at the outputs of FFTs 224, and not data as averaged for purposes of detecting electric fields produced by stray voltage fields above a threshold. This is because the averaging and other processing of the measured field data for producing an audible alarm 235 suitable for interpretation by an operator is arranged to produce an audible output that is suitable in view of the characteristics of the human ear, and which typically is not suitable for analyzing the measured field data for technological analysis or other purposes.

Preferably, the measured "raw" data and GPS location information are stored in a convenient format in a memory of the laptop computer 290 or in another memory device. While such data could be stored in a relational or other database, storing the data as comma-delimited or as tab-delimited ASCII data provides a convenience in that the stored data can easily be exported into a spreadsheet, e.g., a Microsoft Excel spreadsheet, or database, as may be desired.

It is noted that the arrangement of FIG. 5 employs a wheel speed sensor for providing an indication of the speed at which system 100, and specifically sensing probe 110 thereof, is moving, as is described below in conjunction with FIGS. 8-10. It is further noted that there is no need for a 60 Hz reference transmitter in the arrangement of system 100.

Power conversion circuitry 245 provides the various voltages for operating the DSP 210 and other electronic devices. Typically, electrical power for sensor system 100 may be obtained from any convenient electrical power source, such as the electrical system or battery 105 of the vehicle (e.g., truck) on or with which sensor system 100 is operated or a separate battery.

Figure 7:
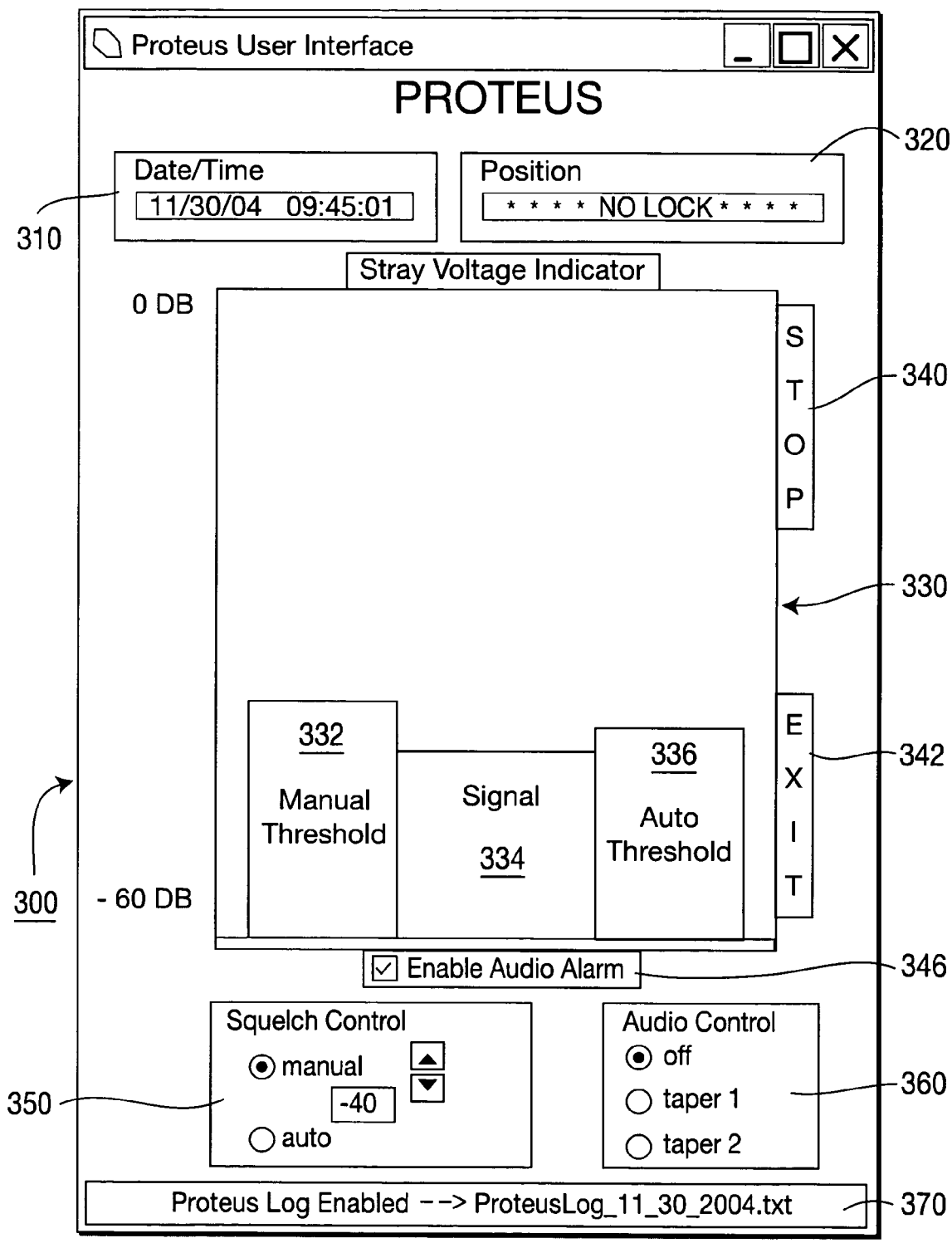
FIG. 7 is an example screen display of a graphical computer interface.

FIG. 7 is an example screen display of a graphical computer interface (GUI) 300 for stray voltage detection system 100 that may be displayed on the monitor 295 of optional computer 290, e.g., for monitoring and/or controlling the operation of system 100. The GUI 300 preferably runs on a computer running the Microsoft Windows XP operating system for providing a visual display of stray voltage signal strength 334 relative to a user-selected manual threshold value 332 and an automatically determined threshold value 336. An alarm, e.g., either an audio alarm via loudspeaker 235 or a visual alarm, e.g., on GUI 300, is provided whenever the detected stray voltage signal 334 exceeds the active defined threshold level 332, 336. All data collected is stored in a "log file" which is typically stored on the hard drive memory of computer 290 or in another storage medium.

Upon start up, typically initiated by clicking on an icon displayed on the "desktop" on monitor 295 of computer 290, the computer program (e.g., which is named PROTEUS) initializes, displays an initial identification screen, displays the GUI 300 screen, and automatically enables the stray voltage data collection mode and retrieves data reading produced by the DSP unit 210. Example default settings invoke the manual threshold mode 332, enable the audio alarm function 346, 350 for detected stray voltage signals exceeding the defined threshold, and disable a continuous tone mode wherein DSP 220 generates a tone that may vary in pitch and/or amplitude to indicate various stray voltage levels.

Near the top of GUI 300 are two windows 310, 320 that respectively indicate the present date and time 310 and the present position of system 100, e.g., as determined by the optional GPS locator 250. In the GUI 300 screen illustrated, a GPS-determined location data is not available and so a "No Lock" message is displayed in position window 320.

In the central region of GUI 300 is the relatively large stray voltage indicator window 330 in which is provided a side-by-side visual display of a user-selected manual threshold value 332, of stray voltage signal strength 334 and of an automatically determined threshold value 336. This convenient example graphic display allows a user to monitor the operation of system 100, and offers various control buttons by which the user may alter and/or control such operation. A bright color, e.g., yellow may be utilized to indicate the threshold that the program will utilize to indicate an excessive stray voltage level. A stray voltage signal level above −60 dB and below the selected threshold is displayed with a green background, and a stray voltage signal level above the selected threshold is displayed in red, and also triggers the audio alarm, if enabled.

At the right edge of window 330 is a button STOP 340 providing a toggle action that when clicked stops the collection of stray voltage data and changes to a START button that is clicked to start collection of stray voltage data, thereby providing the ability to temporarily stop and start the data collection process. Clicking on EXIT button 342 transfers the data files (log files) from file buffers to storage on the hard drive of computer 290, terminates operation of the computer program controlling system 100, and returns the user to the desktop of computer 290.

Below window 330 are buttons and windows for controlling the audio alarm function. Audio Alarm Enable button 346 may be clicked on to enable and disable (mute) the audio alarm function. Enablement of the audio alarm is indicated by the display of a check.

Squelch control window or panel 350 provides buttons for selecting the manual threshold 332 or the automatic threshold 336, and if the manual threshold 332 is selected, for setting and adjusting the level thereof, e.g., in dB.

Audio control window or panel 360 provides buttons for selecting from among various predetermined audio profiles (tapers) or selecting no taper, as a user may prefer. For example, one taper selection assigns the pitch of the audio tone to relate to the sensed stray voltage level and the other taper assigns the pitch to relate to the power level thereof.

Log files are automatically created and stored, e.g., as comma delimited files, and are assigned a standardized file name, e.g., "ProteusLog_mm_dd_yyy" for ease of identification, where "mm_dd_yyy" indicates month, day and year. Each data collection point is represented in a line of six data values that begins with "$PROTEUS" followed by data values for the largest measured stray voltage from among the six probes, the automatic stray voltage threshold value calculated by DSP 210, the user selected fixed manual stray voltage threshold value, the measured vehicle velocity (e.g., in miles per hour), the distance traveled since the last reset of DSP 210 (e.g., as measured in counts from wheel sensor

260 at four counts per revolution), and the current audio alarm tome mode as set from controls 346, 350 of GUI 300. When a stray voltage value exceeding the active threshold occurs, an extra line entry (e.g., "*EXCESSIVE VOLTAGE DETECTED: xxx DB*") is made.

Each comma delimited GPS position data line has 14 data values and begins with "$GPGGA" which indicates the data is in the format of the NMEA-0183 GGA message protocol established by the National Maritime Electronics Association (NMEA). The 14 data item values include a Universal Time Code (UTC or "Zulu" time), latitude (in degrees), N for North or S for South, longitude (in degrees), E for East or W for West, GPS Quality indicator (coded value 0, 1 or 2), number of GPS satellites used for location (ignore), GPS Horizontal Dilution of Precision (HDOP, ignore), altitude, altitude units (e.g., M for meter), geoidal separation (ignore), units therefor (ignore), age of differential (ignore), and differential reference station (ignore), followed by a checksum of all the characters of the string (e.g., obtained by an exclusive OR (XOR) of all of the characters).

Figure 8A:
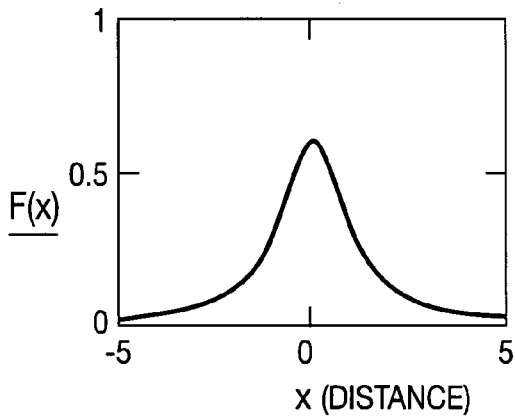
FIGS. 8A and 8B are graphical representations of a theoretical electric field profile and a measured electric field profile, respectively.
Figure 8B:
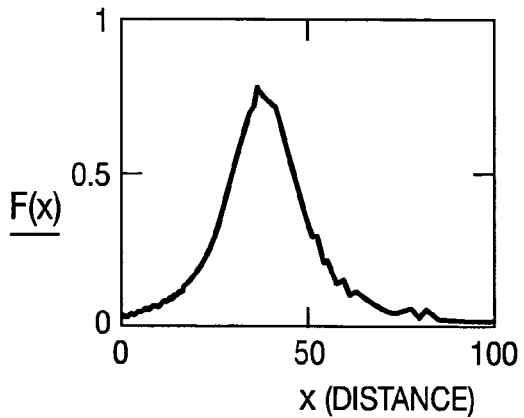
Figure 9:
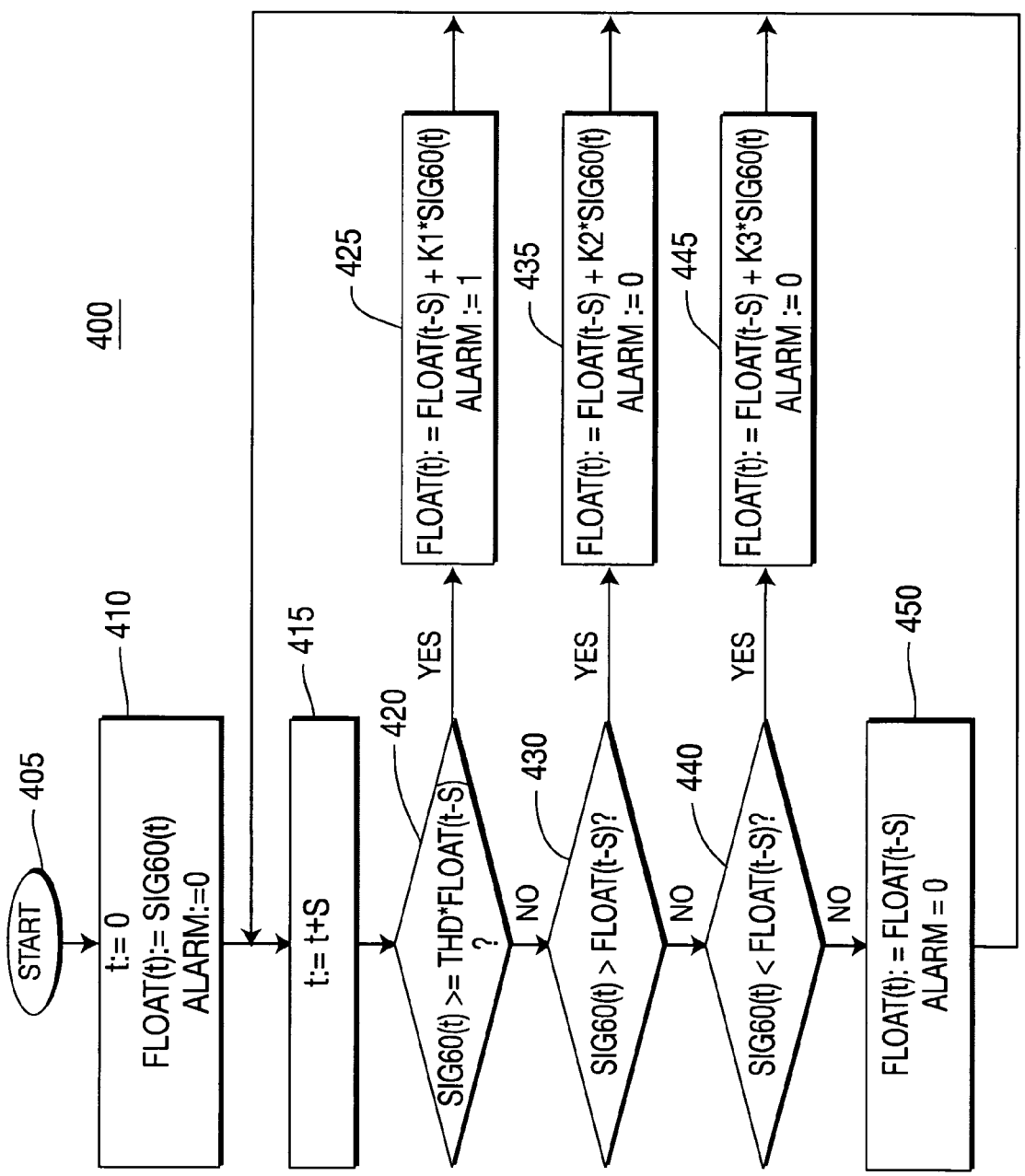
FIG. 9 is a schematic flow diagram illustrating an embodiment of a method for obtaining a running average and an alarm trigger.

Method for Discriminating between Stray Voltage Electric Field and Temporal Background Electric Field Noise:

FIGS. 8A and 8B are graphical representations of a theoretical electric field profile and a measured electric field profile, respectively, and FIG. 9 is a schematic flow diagram illustrating an embodiment of a method 400 for obtaining a running average (FLOAT) and an alarm trigger (ALARM=1). The abscissa thereof represents distance x (in arbitrary units) and the ordinate thereof represents normalized electric field as a function of distance F(x).

The output signal from a stray voltage detection sensor 110, 110' described herein typically contains a considerable amount of noise due to detection of background 60 Hz electric field. Due to the motion of sensor probe 110, 110' in this background field, the amplitude of the background noise signal produced thereby is constantly changing, even when the strength of the background electric field is constant. Further, movement of the sensor probe 110, 110' in any electric field (even a static field, such as one generated by the air flow over the surface of a vehicle tire) results in modulation of such field and, in general, in the generation of a phantom 60 Hz signal. Under such circumstances, discriminating between a legitimate stray voltage electric field and background noise becomes difficult and requires prolonged training of the operator, combined with a high level of operator concentration during the operation of the equipment.

A method for automatically discriminating between a legitimate stray voltage signal and background noise can supplement the processing and reduce the stress imposed on the operator. The method described is based on Coulomb's law, which states that the magnitude of the electric field of a point charge is directly proportional to the charge (Q) and indirectly proportional to the square of distance (r) from the point charge:

$E = kQ/r^2$, wherein proportionality is indicated by a selectable constant (k).

Considering the geometry, where the stray voltage detection sensor 100 probe 110, 110', 110" passes the point charge on a straight line at a minimum distance of R (either directly above the point charge or on the side of the charge or both), the electric field magnitude as a function of distance x from the closest approach (x equals 0) is given by:

$E(x) = kQ/(R^2 + x^2)$.

Qualitatively, the theoretical electric field profile F(x) as the Stray Voltage Detection Sensor 100 probe 110, 110', 110" passes by is depicted in FIG. 8A and is in very good agreement with actual measurements of electric field profile F(x) as shown in FIG. 8B that were made using a stray voltage detection system 100 as described herein.

Although the location of the source of a stray voltage anomaly or condition is not known, the characteristic of the observed electric field variation F(x) in time remains the same and thus, if it is normalized with respect to time and amplitude, it can be discriminated from other temporal signal fluctuations (noise). Normalization in time is accomplished by varying the rate at which the fast Fourier transform (FFT) of the sensed electric field is re-performed as a function of the lateral speed of the stray voltage detection sensor probe 110, 110', e.g., the speed of the vehicle on which probe 110, 110' is mounted. Normalization in amplitude is accomplished by observing the ratio between the amplitude of a fresh sample of the sensed electric field and a running average from the amplitudes of all past samples thereof.

Specifically, normalization in time is accomplished by varying the frequency at which the FFT is performed, such as performing one FFT per unit of travel of the stray voltage detection sensor probe 110, 110'. For example, one FFT could be performed per every unit of distance (e.g., a foot or meter) of travel, e.g., as measured by the wheel speed sensor 260 sensing wheel W rotation or by a distance measuring wheel. Preferably, the time period between FFT sampling should be rounded such as to be an integer multiple of the period of the monitored electric field signal (in this example, an integer multiple of 1/60 sec. for a 60 Hz signal).

Such normalization in time and in amplitude is illustrated, e.g., in the flow diagram of FIG. 6, as described above.

FIG. 9 is a schematic flow diagram illustrating an example embodiment of a method 400 for obtaining a running average (termed FLOAT) and alarm trigger (ALARM=1). A running average is difficult to calculate on a sample with an open ended number of data points, and calculating an average from the last N samples may not be satisfactory unless the number N is very large, which can impose undue demands on DSP 220 and memory 225. Instead, a modified running average algorithm is employed and is described in relation to the algorithm flowchart shown in FIG. 9, which also illustrates the conditions for activating the alarm condition (ALARM=1).

Method 400 starts 405 with an initialization 410 of time t, an average, represented by FLOAT(t), and the alarm value ALARM. For each time t thereafter (referred to as a "fresh time"), the time value or sample rate is updated 415 by an increment value S that is related to speed, e.g., the output of wheel speed sensor 260. For example, the interval S may correspond to a ¼ revolution of wheel W, e.g., four detections per wheel revolution. Thus, if the vehicle carrying system 100 moves faster, then the sampling time t=t+S becomes shorter and the averages and processing occurs more frequently. Conversely, if the vehicle moves more slowly, then the sampling time increases. The processing interval may be thought of as being fixed in space, rather than in time. This variable time interval implements the processing of sensed voltage data as a function of the speed of system 100 to produce signals of the sort illustrated in FIGS. 8A and 8B.

When the probe is stopped, i.e. its speed is zero, no further calculation is made, which is not of concern because no additional voltage field data is being sensed that would need to be averaged. Processor 210 will continue to process stray voltage sensed by probe 110 even if the probe 110 is stopped. However, periodic comparisons 420 of the present value of SIG60(t) could be made so that the alarm function 425 remains operative in the event that a stray voltage appears during the time the probe 110 is stopped.

For each fresh time t=t+S, the filtered and processed 60 Hz signal [SIG60(t)] produced by the fast Fourier transform described above is compared 420 with the threshold above the previous average [THD*FLOAT(t-S)] of the previous time and if greater than or equal to the threshold (420=YES), then the average [FLOAT(t)] is updated 425 by adding the fresh value SIG60(t) adjusted by a weighting factor [K1] to the previous average [FLOAT(t-S)] and, because the threshold is exceeded, the alarm is set [ALARM=1] to cause an audible and/or visual alarm to be provided. If not (420=NO), the fresh 60 Hz signal SIG60(t) is compared 430 with the previous average [FLOAT(t-S)] and if greater (430=YES), then the average [FLOAT(t-S)] is updated by adding the fresh value SIG60(t) adjusted by a weighting factor [K2] and the alarm remains not set [ALARM=0]. If not (430=NO), the 60 Hz signal is compared 440 with the previous average [FLOAT(t-S)] and if less (440=YES), then the average [FLOAT(t-S)] is updated by subtracting the fresh value SIG60(t) adjusted by a weighting factor [K3] and the alarm remains not set [ALARM=0]. If none of the foregoing comparisons 420, 430, 440 produces a YES condition, then the average [FLOAT(t)] remains 450 the previous average [FLOAT(t-S)], alarm remains not set [ALARM=0], and the process is repeated (to 415) for the next time increment t+S.

The constants K1, K2, K3 and THD 8 depend on the background noise characteristics, the desired sensitivity of the discrimination, and the level of tolerable false alarms. Because it is not desirable that the relatively higher values of SIG60(t) when a stray voltage exceeding threshold is detected (420=YES) cause the average FLOAT (which is desired to represent background signals and noise) to increase correspondingly, a relatively lower scaling factor K1 is utilized under that condition. It also appears desirable that FLOAT increase less strongly for noise in excess of the average FLOAT than for noise less than the average FLOAT. Because large changes are weighted less than small changes, this selection of constants tends to produce a result that is akin to low-pass filtering, because the effect of large short-term changes is diminished. Analysis of available data suggests that values of weighting factors K1=0.002, K2=0.02, K3=0.04 and of the threshold factor THD=2.4 would be a reasonable starting point for an application involving sensing stray 60 Hz voltages in a utility service (e.g., street) environment.

Figure 10:
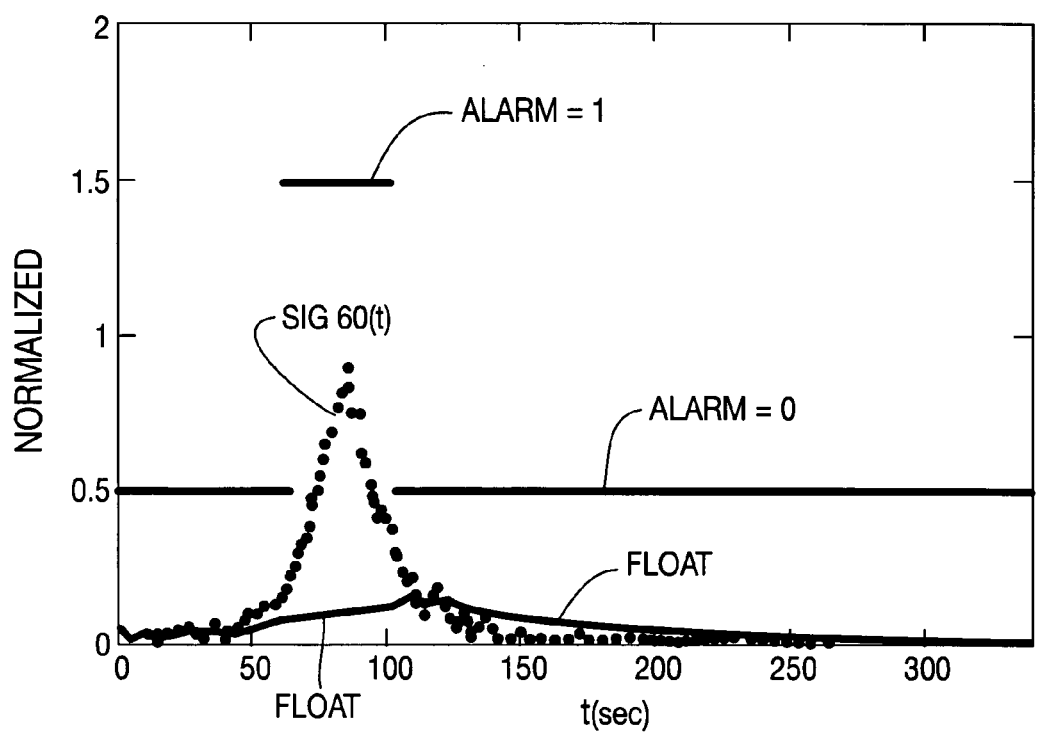
FIG. 10 is a graphical presentation of an example of data produced by the method described in relation to FIG. 9.

FIG. 10 is a graphical presentation of an example of data produced by the method 400 described in relation to FIG. 9. The abscissa represents units of time t (or of distance) whereas the ordinate represents units of amplitude. Data points SIG60(t) represent the value of electric field sensed by a pair of probes 110 versus time t as the system 100 moves along a path. SIG60(t) exhibits a peak in the stray voltage in the region of values of about 60-100, and relatively low values both before and after the peak. The values of SIG60(t) are averaged (e.g., the FLOAT averaging as described above) and present as the graph line FLOAT which remains relatively low and stable (e.g., about 0.1 units) where no significant field is detected, but which increases in the region where a peak of the field SIG60(t) occurs. When the detected field value SIG60(t) exceeds the threshold, e.g., set at about 2.4 FLOAT, the high detected field value causes the alarm to change from no alarm [ALARM=0] to the alarm [ALARM=1] condition to produce an audio tone and/or visual indication thereof to the user. The illustrated data was produced by one pair of probes 110y-110y of system 100 moving past an energized light pole at a speed of about 18 mph (about 30 km/hr).

As used herein, the term "about" means that dimensions, sizes, formulations, parameters, shapes and other quantities and characteristics are not and need not be exact, but may be approximate and/or larger or smaller, as desired, reflecting tolerances, conversion factors, rounding off, measurement error and the like, and other factors known to those of skill in the art. In general, a dimension, size, formulation, parameter, shape or other quantity or characteristic is "about" or "approximate" whether or not expressly stated to be such.

While the present invention has been described in terms of the foregoing example embodiments, variations within the scope and spirit of the present invention as defined by the claims following will be apparent to those skilled in the art. For example, while single and differential sensing probe arrangements 110, 110' employing ones or electrodes or pairs of spaced apart electrodes have been described, other probe arrangements could be provided. For example, outputs from each probe electrode 100x, 100y and/or 100z, could be amplified, filtered and/or processed in conjunction with that from any other electrode or any combination thereof.

In general, however, opposing spaced-apart differential probe electrode pairs 110x-110x, 110y-110y and/or 110z-110z as described herein have been observed to provide sensitivity that is at least as good as, and that is typically better in terms of signal-to-noise ratio than, that of any single electrode, particularly when the sensing probe 110 is moving, as when it is on or is towed behind a moving vehicle. In addition, the standard deviation of the noise signal from an average or other combination of the three differential signal measurements appears to be consistently lower than from any other measurement.

Also, while the described arrangements of electrodes 110x, 110y, 110z, and of auxiliary electrodes 1110x, 1110y, 1110z, generally include electrodes of similar size and shape and auxiliary electrodes of like size and shape so as to define respective cubical spaces, the electrodes and/or auxiliary electrodes need not be of the same size and shape, and need not define cubical space, although the electrodes of each respective pair of electrodes are preferably of like size and shape and the electrodes of each respective pair of auxiliary electrodes are preferably of like size and shape.

Further, while a vehicle-borne sensor system 100 is described, it is contemplated that apparatus employing the arrangements and methods described herein may be provided in a case or backpack that could be carried by a person. In such arrangement, sensing probe 110 could be a one-dimensional arrangement, similar to that of FIG. 1A. In addition, laptop computer 290 which provides certain operator controls, would not need to be included, or could be replaced by a personal digital assistant or other small device, thereby further lightening the apparatus to be carried.

Additional features may be provided, as desired. For example, a 60-Hz signal source located inside sensor probe 110, 110', 110" to couple a 60-Hz signal thereto could provide a self-test function, i.e when a self-test is performed by energizing the 60-Hz source. System 100 would then produce an audio indication, Log file, and/or other output, for a qualitative and/or quantitative test. Further, calibration and/or performance verification could be provided by locating probe 110, 110', 110" and a commercially available accurate E-field measuring instrument at close range to a source of a relatively high field strength 60 Hz signal.

While the foregoing sensor, system, apparatus and method are described in terms of the 60 Hz electrical power system frequency common in the United States and other countries, the apparatus, arrangements and methods described herein are likewise applicable to the 50 Hz power systems of Europe and elsewhere, to the 400 Hz power systems for aircraft and other apparatus, to the 25 Hz power systems for transportation and other applications, and to power systems at any other frequency. Further, while the arrangement is often described in terms such as "stray voltage" and "voltage anomaly" and "stray voltage" field, it is noted that the electric field produced by the conditions so referred to is sensed and/or detected by the described arrangement.

Numerical values stated are typical or example values, and are not limiting values. For example, other sizes of probe plates 110, support structures 130, 130', 130", 140, 160, other low-pass filter 205 cutoff frequencies, other analog-to-digital converter 215 sampling rates, other audible tone pitches and pitch relationships, and the like, may be utilized.

APPENDIX A

Sensor System Command Set Listing

A brief description of example stray voltage detection (SVD) system 100 commands that are available to a user on computer 290, follows. Commands may be executed in response to the symbol (given at the left margin below) being entered via the keyboard of computer 290, or by a point-and-click entry. Commands that are expected to be more commonly used are indicated in bold type:

| | |
|---|---|
| H | Display Help Screen - Causes the Help screen that lists all commands to be displayed. |
| \*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\*\* | |
| { | Enter GPS Console Mode - Console 290 directly communicates with GPS 250 and all keyboard entries are forwarded to GPS 250, i.e. not interpreted as SVD commands) |
| } | Exit GPS Console Mode |
| Z | Display Zulu time to the console (time from GPS 250, if available) |
| V | Display current software Version number |
| L | Display the current GPS Latitude, Longitude, Elevation and Zulu time |
| > | Enter Stray Voltage Detect Data Spew Mode - Data for all six probe plates is displayed at the 3.75 Hz rate at which it is produced |
| < | Exit Stray Voltage Detect Data Spew Mode |
| + | Increase SVD audio alarm manual threshold by 1 dB (only in "P" or "D" beeper modes) |
| - | Decrease SVD audio alarm manual threshold by 1 dB (only in "P" or "D" beeper modes) |
| P | Differential Probe Mode OFF - Beep (audio tone) if signal from any probe plate 110 exceeds the SVD threshold. (500 Hz tone @ 50% duty cycle at 3.75 Hz rate) |
| D | Differential Probe Mode ON - Audio tone pitch is based on average of signals of all three differential plate pairs if in "S" or "U" modes (otherwise 500 Hz tone @ 50% duty cycle at 3.75 Hz rate if any differential pair of probes exceeds SVD threshold) |
| X | Disable (or mute) the beeper (audio tone) until "P" or "D" or "S" command |
| S | Audio tone pitch set proportional to 60 Hz field strength \*squared\* |
| U | Audio tone pitch is un-weighted average of last 32 magnitude squared values. |
| \| | Toggle display to the next of speed (in mph), distance (in wheel speed pulses) and OFF |
| F | Display current vehicle speed (in mph). |
| A | Put DSP in Automatic (data streaming) mode to display Log file as it is generated |
| M | Put DSP in Manual mode (for terminal 290 control), exiting the "A" mode |

-continued

| | |
|---|---|
| # | Spew data display for the three differential probe pairs at a 60 lines/sec rate. |
| T | Increase the "singer" (audio tone) cutoff threshold by ~0.5 dB and display new value |
| t | Decrease the "singer" (audio tone) cutoff threshold by ~0.5 dB and display new value |
| G | Increase "singer" (audio tone) pitch gain by ~1 dB and display new value |
| g | Decrease "singer" (audio tone) pitch gain by ~1 dB and display new value |
| * | Restore default settings. |
| 0 | Operate in Differential Mode with tone based on average of all six plates (same as D above) |
| 1 | Operate in Differential Mode with tone based on plates 1-2 (top and bottom plates) |
| 2 | Operate in Differential Mode with tone based on plates 3-4 (left and right plates) |
| 3 | Operate in Differential Mode with tone based on plates 5-6 (fore and aft plates) |
| 4 | Connect X auxiliary electrodes together (toggle connect/disconnect) |
| 5 | Connect Y auxiliary electrodes together (toggle connect/disconnect) |
| 6 | Connect Z auxiliary electrodes together (toggle connect/disconnect) |
| $ | Connect X auxiliary electrodes to common (toggle connect/disconnect) |
| % | Connect Y auxiliary electrodes to common (toggle connect/disconnect) |
| ^ | Connect Z auxiliary electrodes to common (toggle connect/disconnect) |

Note:
Unrecognized characters generate a question mark "?" and an echo of that character to indicate that an invalid command has been entered.

What is claimed is:

1. A method for detecting an electric field comprising:
receiving a digitized representation of an electric filed sensed by at least one electric sensing probe adaptalbe for mobility about a plurality of electric fields;
determining a speed at which the at least one electric field sensing probe is moving;
processing the digitized representation of the electric field, wherein signal averaging associated with the digitized representation of the electric field is adjusted commensurate with the speed at which the electric field sensing probe is moving; and
comparing the processed digitized representation of the electric field with a threshold and providing a human perceivable indication of the detected electric field.

2. The method of claim 1, wherein receiving the digitized representation of the electric field includes:
placing an electric field sensing probe having at least one pair of spaced apart electrically conductive electrodes in an electric field; and
digitizing electrical signals produced by the electric field sensing probe in response to the electric field.

3. The method of claim 2 further comprising:
providing a pair of spaced apart electrically conductive auxiliary electrodes, wherein the electric field sensing probe is disposed in a space defined between the pair of spaced apart electrically conductive auxiliary electrodes; and
selectively electrically connecting the pair of spaced electrically conductive electrodes together, or selectively electrically connecting the pair of spaced apart electrically conductive electrodes to a common reference, or selectively electrically connecting a pair of spaced apart electrically conductive electrodes together and to a common reference.

4. The method of claim 1 wherein averaging the digitized representation of the electric field further comprises:
averaging using an unweighted average; or
averaging using an unweighed average including one or more predetermined weighting factors; or
averaging using a weighted average including one or more selectable weighting factors; or
any combination of the foregoing.

5. The method of claim 4 wherein the weighting factor applied when the digitized representation of the electric field exceeds the threshold is substantially smaller than the weighting factor applied when the digitized representation of the electric field does not exceed the threshold.

6. The method of claim 1 wherein determining the speed includes measuring speed, or measuring distance, or sensing wheel speed, or sensing wheel revolution, or GPS locating, or imaging, or video imaging, or TV camera imaging, or any combination of the foregoing, for determining the speed.

7. A method for detecting an electric field comprising:
receiving a digitized representation of an electric field;
processing the digitized representation of the electric field, wherein processing of the digitized representation of the electric field includes performing a Fast Fourier Transform on the digitized representation of the electric field at a rate that is a multiple of the expected frequency of the electric field; and
comparing the Fast Fourier Transformed digitized representation of the electric field with a threshold and providing a human perceivable indication of the detected electric field. field with a threshold to provide a human perceivable indication of the electric field.

8. The method of claim 7 wherein said receiving the digitized representation of the electric field includes:
placing an electric field sensing probe having at least one pair of spaced apart electrically conductive electrodes in an electric field; and
digitizing electrical signals produced by the electric field sensing probe in response to the electric field.

9. The method of claim 8 further comprising:
placing a pair of spaced apart electrically conductive auxiliary electrodes, wherein the electric field sensing probe is disposed in a space defined between the pair of spaced apart electrically conductive auxiliary e;ectrp-des; and
selectively electrically connecting the pair of spaced apart electrically conductive electrodes together, or selectively electrically connecting the pair of spaced apart electrically conductive electrodes to a common reference, or selectively electrodes connecting the pair of spaced apart electrically conductive electrodes together and to a common reference.

10. The method of claim 8 wherein processing the digitized representation of the electric field further comprises:
averaging the Fast Fourier Transformed digitized representation of the electric field at a rate that is related to a speed at which the electric field sensing probe is moving, and
comparing the Fast Fourier Transformed digitized representation of the electric field with a threshold representative of the averaged Fast Fourier Transformed digitized representation of the electric field to provide the human perceivable indication of the electric field.

11. The method of claim 10 wherein averaging the Fast Fourier Transformed digitized representation of the electric field further comprises:
averaging using an unweighted average; or
averaging using a weighted average including one or more predetermined weighting factors; or
averaging using a weighted average including one or more selectable weighting factors; or
any combination of the foregoing.

12. The method of claim 11 wherein the weighting factor applied when the Fast Fourier Transformed digitized representation of the electric field exceeds the threshold is substantially smaller than the weighting factor applied when the Fast Fourier Transformed digitized representation of the electric field does not exceed the threshold.

13. The method of claim 10 further comprising measuring speed, or measuring distance, or sensing wheel speed, or sensing wheel revolution, or GPS locating, or imaging, or video imaging, or TV camera imaging, or any combination of the foregoing, for determining the speed at which the electric field sensing probe is moving.

14. The method of claim 7 further comprising measuring speed, or measuring distance, or sensing wheel speed, or sensing wheel revolution, or GPS locating, or imaging, or video imaging, or TV camera imaging, or any combination of the foregoing, for determining a location corresponding to the human perceivable indication of the detected electric field.

15. The method of claim 7 wherein the human perceivable indication of the electric field includes a visual indication, or any combination of the foregoing.

16. The method of claim 15 wherein the audible indication is configured to emit a tone having a pitch that is logarithmically related to electric field strength.

17. The method of claim 16 wherein:
the logarithmic relationship produces about a one octave change in pitch of the audible indication tone for each about 10 dB change in electric field strength; or
the pitch is changed by an increment that is less than or equal to about an eighth of a step in an equal tempered chromatic scale; or
the pitch is in a range from about 70 Hz to about 2.5-3 KHz; or
any combination of the foregoing.

18. The method of claim 7 further comprising:
storing the Fast Fourier Transformed digitized representation of the electric field; or
averaging the Fast Fourier Transformed digitized representation of the electric field and storing the average thereof; or
storing the Fast Fourier Transformed digitized representation of the electric field and a representation of speed, or distance, or location, or a combination of the foregoing; or
averaging the Fast Fourier Transformed digitized representation of the electric field and storing the average thereof and a representation of speed, or distance, or location, or a combination of the foregoing; or
storing the human perceivable indication of the electric field; or
any combination of the foregoing.

* * * * *